(12) United States Patent
Nearman et al.

(10) Patent No.: US 8,172,097 B2
(45) Date of Patent: May 8, 2012

(54) LED DISPLAY MODULE

(75) Inventors: Nathan Lane Nearman, Brookings, SD (US); Shannon Lee Mutschelknaus, Brookings, SD (US); Matt Ray Mueller, Brookings, SD (US); Brett David Wendler, Watertown, SD (US); Eric Steven Bravek, Brookings, SD (US); Robert James Lutz, Bruce, SD (US); Ryan Mark Hansen, Watertown, SD (US); Nick Joeseph Fanning, Arlington, SD (US)

(73) Assignee: Daktronics, Inc., Brookings, SD (US)

( * ) Notice: Subject to any disclaimer, the term of this patent is extended or adjusted under 35 U.S.C. 154(b) by 812 days.

(21) Appl. No.: 11/642,221

(22) Filed: Dec. 20, 2006

(65) Prior Publication Data

US 2008/0078733 A1 Apr. 3, 2008

(51) Int. Cl.
A47B 43/00 (2006.01)

(52) U.S. Cl. .................................. 211/189
(58) Field of Classification Search ............ 211/189; 40/407, 406, 448; D20/19; 340/815.45, 340/815, 45; 345/30
See application file for complete search history.

(56) References Cited

U.S. PATENT DOCUMENTS

| | | | | |
|---|---|---|---|---|
| 3,291,975 A * | 12/1966 | McCullough et al. | ........ | 362/235 |
| 3,594,761 A * | 7/1971 | Boesen et al. | .......... | 345/30 |
| 4,234,914 A * | 11/1980 | Boesen | .......... | 362/240 |
| 4,659,876 A * | 4/1987 | Sullivan et al. | .......... | 379/93.19 |
| 5,020,253 A * | 6/1991 | Lie et al. | .......... | 40/576 |
| 5,027,112 A | 6/1991 | Ross et al. | | |
| 5,132,674 A | 7/1992 | Bottorf | | |
| 5,184,116 A * | 2/1993 | Daugherty et al. | .......... | 345/109 |
| 5,198,723 A * | 3/1993 | Parker | .......... | 313/634 |
| 5,268,828 A | 12/1993 | Miura | | |
| 5,353,536 A * | 10/1994 | Erber et al. | .......... | 40/606.1 |
| 5,410,328 A | 4/1995 | Yoksza et al. | | |
| 5,559,529 A | 9/1996 | Maher | | |
| 5,617,657 A * | 4/1997 | Kahn | .......... | 40/406 |
| 5,743,610 A | 4/1998 | Yajima et al. | | |
| 5,759,044 A | 6/1998 | Redmond | | |
| 5,949,581 A | 9/1999 | Kurtenbach | | |
| 6,309,074 B1 * | 10/2001 | Inbar et al. | .......... | 353/120 |
| 6,314,669 B1 * | 11/2001 | Tucker | .......... | 40/448 |
| 6,414,650 B1 | 7/2002 | Nicholson et al. | | |
| 6,661,429 B1 | 12/2003 | Phan | | |
| 6,677,918 B2 | 1/2004 | Yuhara et al. | | |
| D487,779 S * | 3/2004 | Rose | .......... | D20/19 |
| 6,705,033 B1 * | 3/2004 | Greene et al. | .......... | 40/546 |

(Continued)

FOREIGN PATENT DOCUMENTS

EP 1202162 A1 5/2002

(Continued)

OTHER PUBLICATIONS

"U.S. Appl. No. 12/217,003, Non Final Office Action mailed Aug. 5, 2011", 23 pgs.

(Continued)

*Primary Examiner* — Sarah Purol
(74) *Attorney, Agent, or Firm* — Schwegman, Lundberg & Woessner, P.A.

(57) ABSTRACT

An LED display module having features for improvement over prior art devices by providing novel features for improved LED visibility, improved weather and climatological sealing, improved electromagnetic interference (EMI) suppression, improved heat dissipation, and improved airflow.

19 Claims, 17 Drawing Sheets

U.S. PATENT DOCUMENTS

| | | | |
|---|---|---|---|
| 6,729,054 B1 * | 5/2004 | VanderTuin | 40/452 |
| 6,741,222 B1 * | 5/2004 | Tucker | 345/1.1 |
| 6,813,853 B1 * | 11/2004 | Tucker | 40/448 |
| 6,816,389 B1 | 11/2004 | Lutz et al. | |
| 6,831,653 B2 | 12/2004 | Kehlet et al. | |
| 6,926,375 B2 | 8/2005 | Nagamine et al. | |
| 6,966,674 B2 | 11/2005 | Tsai | |
| 6,994,448 B1 * | 2/2006 | Gorrell | 362/183 |
| 7,014,916 B2 * | 3/2006 | Tanabe | 428/447 |
| 7,050,024 B2 | 5/2006 | LeChevalier et al. | |
| 7,055,271 B2 * | 6/2006 | Lutz et al. | 40/605 |
| D526,361 S * | 8/2006 | Yasuoka et al. | D20/10 |
| 7,344,902 B2 * | 3/2008 | Basin et al. | 438/27 |
| 7,355,562 B2 * | 4/2008 | Schubert et al. | 345/1.3 |
| 7,907,133 B2 | 3/2011 | Joffer et al. | |
| 7,916,156 B2 | 3/2011 | Brown Elliott et al. | |
| 7,928,968 B2 | 4/2011 | Shon et al. | |
| 7,969,456 B2 | 6/2011 | Brown Elliott et al. | |
| 2002/0059742 A1 * | 5/2002 | Okazaki et al. | 40/550 |
| 2002/0140655 A1 | 10/2002 | Liang et al. | |
| 2003/0058191 A1 | 3/2003 | Yuhara et al. | |
| 2003/0217495 A1 * | 11/2003 | Nagamine et al. | 40/605 |
| 2004/0046721 A1 | 3/2004 | Yang | |
| 2004/0130536 A1 * | 7/2004 | Tanabe | 345/173 |
| 2004/0150651 A1 | 8/2004 | Phan | |
| 2005/0081414 A1 * | 4/2005 | Lutz et al. | 40/564 |
| 2005/0259418 A1 | 11/2005 | Callegari et al. | |
| 2006/0092162 A1 | 5/2006 | Deering et al. | |
| 2006/0105485 A1 * | 5/2006 | Basin et al. | 438/27 |
| 2006/0232525 A1 | 10/2006 | Chou | |
| 2008/0048200 A1 * | 2/2008 | Mueller et al. | 257/98 |
| 2008/0078733 A1 * | 4/2008 | Nearman et al. | 211/189 |
| 2008/0141570 A1 * | 6/2008 | Nearman et al. | 40/574 |
| 2008/0225143 A1 | 9/2008 | Joffer et al. | |
| 2011/0163942 A1 | 7/2011 | Joffer et al. | |
| 2011/0175888 A1 | 7/2011 | Joffer et al. | |

FOREIGN PATENT DOCUMENTS

| | | |
|---|---|---|
| EP | 1699036 A1 | 9/2006 |
| JP | 2005-0275178 A | 10/2005 |
| WO | WO-91/08565 A1 | 6/1991 |

OTHER PUBLICATIONS

"U.S. Appl. No. 12/217,011, Non Final Office Action mailed Aug. 10, 2011", 13 pgs.

"U.S. Appl. No. 11/786,720, Non-Final Office Action mailed Jun. 24, 2010", 9 pgs.

"European Application No. 08742865.2, Extended European Search Report mailed Aug. 4, 2010", 7 pgs.

"U.S. Appl. No. 13/047,193, Non Final Office Action mailed Aug. 30, 2011", 15 pgs.

"U.S. Appl. No. 13/076,857, Non Final Office Action mailed Aug. 22, 2011", 17 pgs.

"U.S. Appl. No. 11/271,404, Election filed Jan. 7, 2009 in response to Official Action mailed Jan. 2, 2009", 12 pgs.

"U.S. Appl. No. 11/271,404, Official Action mailed Jan. 2, 2009", 5 pgs.

"U.S. Appl. No. 11/786,720, Preliminary Amendment filed Mar. 18, 2008", 12 pgs.

"U.S. Appl. No. 11/786,720, Preliminary Amendment filed Nov. 9, 2009", 10 pgs.

"U.S. Appl. No. 12/217,011, Preliminary Amendment and Filing Receipt Correction filed Sep. 2, 2008", 6 pgs.

"International Application Serial No. PCT/US06/36683, International Preliminary Report on Patentability completed Oct. 10, 2008", 6 pgs.

"International Application Serial No. PCT/US06/36683, International Search Report mailed Aug. 9, 2007", 1 pg.

"International Application Serial No. PCT/US06/36683, Written Opinion mailed Aug. 9, 2007", 4 pgs.

"International Application Serial No. PCT/US07/25456, International Search Report mailed Apr. 16, 2008", 1 pg.

"International Application Serial No. PCT/US07/25456, Written Opinion mailed Apr. 16, 2008", 4 pgs.

"International Application Serial No. PCT/US08/04808, International Search Report mailed Jul. 30, 2008", 2 pgs.

"International Application Serial No. PCT/US08/04808, Written Opinion mailed Jul. 30, 2008", 4 pgs.

"U.S. Appl. No. 11/271,404, Non-Final Office Action mailed Apr. 13, 2009", 7 pgs.

"U.S. Appl. No. 11/271,404, Preliminary Amendment filed Nov. 10, 2005", 11 pgs.

"U.S. Appl. No. 11/786,720, Notice oF Allowance mailed Nov. 16, 2010", 6 pgs.

"U.S. Appl. No. 11/786,720, Response filed Sep. 24, 2010 to Non Final Office Action mailed Jun. 24, 2010", 10 pgs.

"European Application No. 08742865.2, Communication pursuant to Rules 70(2) and 70a(2) EPC dated Aug. 23, 2010", 1 pg.

"European Application No. 08742865.2, Response filed Feb. 23, 2011 to Communication dated Aug. 23, 2010", 13 pgs.

\* cited by examiner

LED DISPLAY MODULE

CROSS REFERENCES TO RELATED APPLICATIONS

This patent application is related to patent application Ser. No. 11/271,404 filed Nov. 10, 2005 entitled "Stackable Electronic Sign System And Mounting Structures Therefor," which is pending. This patent application is also related to patent application Ser. No. 10/688,304 entitled "Electronic Display Module Having a Four-Point Latching System for Incorporation into an Electronic Sign and Process", filed on Oct. 17, 2003, pending. Patent application Ser. No. 10/688,304 claims priority from the earlier filed U.S. Provisional Application No. 60/647,268 filed Jan. 25, 2005, entitled "Electronic Sign". The prior applications are hereby incorporated into this application by reference as if fully set forth herein.

BACKGROUND OF THE INVENTION

Field of the Invention

The present invention is for an LED display module and, more particularly, an LED display module preferably incorporated into use with a connector framework such as featured in patent application Ser. No. 11/271,404 filed Nov. 10, 2005 entitled "Stackable Electronic Sign System And Mounting Structures Therefor," by the inventor(s).

Description of the Prior Art

Small LED Package

Prior art LED display modules often incorporated an arrangement of a plurality of different colored LEDs, such as RGB colors, incorporated into a single structure where such an arrangement is known as an LED package. Multiple LED packages, such as four LED packages, were then combined in a spaced square arrangement and viewed through a single louver viewing port being slightly larger than the arrangement of the four LED packages. In the alternative, a smaller LED package could be observed through a single and smaller louver viewing port. In either case, a large visible white area of the LED package sides surrounding the LED packages adversely affects the contrast of the display, especially when viewed from the side and viewability was deemed unacceptable due to the presence of a "halo" effect resulting in viewing and module uniformity inconsistency. The present invention provides a smaller LED package viewable through reduced size single louver view ports and through co-located individual overmold cavity view ports, wherein the visible white area around the edge of an LED is significantly reduced by one-to-one correlation of a single view port to a single overmold cavity view port. Contrast and viewability is enhanced by the use of a support grid having a dark color, such as black, for purposes of example and illustration.

Weather Seal

The perimeter surface of prior art LED display modules often incorporated a sealant where the module frame came in contact with the louver panel. The sealant attempted to fill in the post-assembly gap left between the frame and the louver panel. After the module had been cycled through expansion and contraction cycles from cold and warm temperatures, the sealant cracked, thereby no longer properly sealing the LED display module. Additionally, the louver panel was designed to fit tightly against the coated surface of the LED printed circuit board, but this arrangement was not watertight and water flowed into the area between the louver panel and the front surface of the LED circuit board where it pooled, causing corrosion of the coating on the LED circuit board and subsequent premature component failure. Prior art louver panels were attached to the module by Mattel pins that extended perpendicularly through the LED printed circuit board and through other components of the module. A small rubber gasket was placed on each Mattel pin near its base to plug the gap between the Mattel pin and the respective hole in the LED printed circuit board but this technique did not reliably serve its purpose since water entered through each respective hole.

The present invention overcomes the inadequacies of the prior art by the use of a panel which is overmolded to and in close association with a louver panel. The side panels of the louver panel form a peripheral lip which wraps around and mostly contains the LED printed circuit board and other closely related components to snappingly engage a peripheral lip of a rearwardly located frame. The overmold panel engages and seals to the front surface of the LED printed circuit board in close proximity to the sides of the LED packages.

Heat Dissipation

The problem with some prior art electronic display modules is that excess heat is produced by the number of LEDs and, therefore, the excess heat is not removed effectively. The heat produced by LED display modules combined with the ambient temperature can produce an unsafe and uneven operating temperature for the LED display modules. In addition, outdoor use of the LED display modules results in even more heat energy being involved due to solar radiation along with extra heat produced by operating the LEDs at an increased intensity to provide proper display brightness for outdoor conditions. Previously, few methods for evenly or effectively removing heat from LED display modules and heat removal in general was accomplished by having as much open area, as possible, at the rear of an LED display module, hoping in most cases for heat dissipation by natural convection. Another ventilation method of cooling electronic display systems is the use of an air conditioning system which is expensive, takes extra installation time, requires more electrical energy to operate, and is noisy. Another ventilation method of cooling electronic display systems is using axial driven fans which are not compact, which are noisy, which produce low pressure, which have a low CFM rating, and which require a large opening. Other ventilation systems, regardless of the type of cooling source, do not have structure on the inside of the panel to force the air over a greater surface area of the panel.

The present invention provides heat dissipation structure which evenly cools the LED display module by the use of a thermal conductive pad, a heat distribution plate and heat sinks associatively incorporated to draw and expel heat therefrom. The present invention provides for ventilation by the use of an internally located centrifugal air pump to forcibly extract heat off the non-viewed side of the LED display assemblies including the heat sinks and associated components in an even and effective manner.

Electromagnetic Interference

Electronic display modules can emit a significant amount of electromagnetic interference (EMI), whereby significant amounts of electromagnetic radiation transmitted from such electronic devices may cause problems such as interference with surrounding electrical devices, such as radios, televisions, cell phones, electronic medical devices and the like, as well as possibly being in violation of FCC regulations for electromagnetic radiations. The present invention provides structure to contain, reduce and suppress any internally generated EMI. One structure is in the form of an electrically grounded rear cover made of a type of plastic having EMI inhibiting qualities which contains, reduces and suppresses EMI. The electrically conductive surfaces within the rear cover are connected to earth ground via a power connection to the LED display assemblies. Other structures, such as, but not limited to, a frame and a louver panel are also constructed of plastic having EMI inhibiting qualities. In the alternative or in addition thereto, the rear support panel and other such structures can be protected with an EMI inhibiting paint or the rear cover and other referenced structures can be expensively fashioned of conductive metal to contain, reduce and suppress any internally generated EMI. However, metal is much heavier than plastic making installation and transportation more difficult. Unlike plastic, metals cannot be as easily formed or molded to various shapes typically beyond block designs and simple radius designs, thereby making the use of components comprising an electronic LED display module having plastic EMI inhibiting qualities a preferred structure.

These above methods will work alone to prevent electromagnetic noise from escaping the electronic sign displays if the rear support panel has no openings or gaps sizeable enough to let a significant amount of electromagnetic noise escape. A problem arises because many of these panels have openings used for ventilation intake and the size of the openings is large enough for significant electromagnetic noise to escape. The present invention provides for EMI protection at any such openings where grounded mesh-like metal screen or EMI material protective screens are placed at the air intake enclosure and centrifugal air pump enclosure to block electromagnetic noise from escaping. In the alternative, use of gaskets having anti-EMI qualities can be used at multiple component contact locations in order to prevent electromagnetic noise from escaping through these areas.

SUMMARY OF THE INVENTION

The general purpose of the present invention is to provide an LED display module having features for improvement over prior art devices by offering novel features for improved visibility of the LEDs, improved weather and climatological sealing, improved EMI (electromagnetic interference) suppression, improved heat dissipation and improved airflow. The LED display module of the present invention includes multiple LED display assemblies having a rear cover secured to the back side thereof.

The LED display module features a plastic louver panel preferably of a dark color having a layer of overmold material such as a thermoplastic elastomer for weather sealing against an LED printed circuit board in close association about individual LED packages. Louver panel view ports having a continuous angled surface and a continuous sub-lip are located along and about a support grid of the louver panel. The visible white area around an LED is significantly reduced by the use of the individual sub-lips, thereby increasing the contrast and improving viewability of the LED packages. A peripheral lip of the louver panel having molded latches wraps around the edges of the LED printed circuit boards and other components and snaps over, about and onto the peripheral lip of a frame having molded-in catches, and further sealed by application of a suitable sealing material at the louver panel frame splice seam. The frame, which is preferably made of plastic having EMI protective material, encases, houses and surrounds the LED printed circuit board, as well as surrounding a thermal conductive pad and a heat distribution plate. The frame has an open front, four solid perimeter sides, a peripheral lip and a back that has a structure to allow for rigidity while having openings allowing electronics from the LED printed circuit board and heat sinks to pass through.

The plastic louver panel with the overmold panel is substantially a unitary structure, but shown herein as separate structures for the purpose of clarity. The overmold panel provides a plurality of single overmold cavity viewing ports. The planar portion of the overmold panel seals against the LED printed circuit board. The overmold cavity viewing ports align in close proximity to and about individual LED packages.

A dedicated heat dissipation structure evenly cools the electronic LED display module. Three static components are used to draw and expel heat from the modules. First, a thermal conductive pad that is not electrically conductive is placed directly on the rear surface of the LED printed circuit board. Second, a heat distribution plate is preferably made of electrically conductive aluminum and is placed over the thermal conductive pad. The combination of the thermal conductive pad and heat distribution plate help dissipate heat from the LED printed circuit board and evenly distribute the heat across the whole volume of the LED display module. Thirdly, heat sinks are secured on the rear of the heat distribution plate to increase the surface area and expedite heat dissipation.

The invention uses a centrifugal air pump to provide cooling air in and out of the LED display module. The air is pulled through and along the interior of the rear cover on a given path to flow over as much surface area of the back of the upper and lower LED display assemblies and along and about the components of the rear cover of the LED display module as possible. The air is forced in a circuitous path because panels in the panel cover extend preferably perpendicularly and forwardly from the interior surface of the rear cover to the rear surface of the rear cover, thus preventing the cooling air from being drawn in through the air intake enclosure inlet and then directly to the centrifugal air pump intake without properly entraining and removing heat residing along the entire interior of the LED display module.

The rear cover includes integral portions consisting of a rear support panel, a rear enclosure panel, an air intake enclosure, and a centrifugal air pump enclosure which are closely associated with and in close proximity to the rear of the LED display assemblies. The rear cover provides EMI protection in one of two main ways. Preferably, the plastic comprising the rear cover can be made of an EMI protective material or, in the alternative, the plastic rear cover can be painted with EMI protective paint. EMI protection may also be provided in the form of screens located in the centrifugal air pump enclosure and in the air intake enclosure. Alternatively, gaskets which can have EMI protection qualities can also be incorporated at multiple locations where the structures mate.

According to one or more embodiments of the present invention, there is provided an LED display module including a louver panel with an overmold panel of thermoplastic elastomer material, LED display assemblies, a frame containing EMI protective material which accommodates and is used for mounting of an LED printed circuit board, a heat distribution plate, a heat distribution plate and a thermal conductive pad, a plurality of heat sinks secured to the back of the heat distribution plate, multiple sealing gaskets having EMI protective material, a one-piece rear cover containing EMI protective material including a support panel, an enclosure panel, an air intake enclosure, a centrifugal air pump enclosure, a centrifugal air pump, an LED display module latching system, as well as numerous other components.

One significant aspect and feature of the present invention is an LED display module for use in indoor and outdoor electronic displays.

Another significant aspect and feature of the present invention is the use of a louver panel of a dark contrasting color to increase the contrast and viewability of LED packages in an LED display assembly.

Another significant aspect and feature of the present invention is the use of a continuous sub-lip included in louver panel view ports to mask the edges of white colored LED packages from view, thereby increasing the contrast and viewability of LED packages in an LED display assembly.

One significant aspect and feature of the present invention is the use of a single LED package within a single louver panel view port to create a perceived doubling effect of the contrast by viewers by greatly reducing the white space about an LED package.

Still another significant aspect and feature of the present invention is the use of overmold panel material which is soft and flexible which can be aggressively molded in very close proximity to an LED package without incurring LED package damage.

Yet another significant aspect and feature of the present invention is the use of an overmold panel to effect a seal between the hard plastic louver panel and an LED printed circuit board, as well as closely about LED packages.

Yet another significant aspect and feature of the present invention is a louver panel designed to allow for 140° viewing in all directions.

Yet another significant aspect and feature of the present invention is a louver panel provided to protect the LED packages from abuse.

Yet another significant aspect and feature of the present invention is the use of an overmold panel having a plurality of overmold cavity view ports which are in close proximity to the plurality of LED packages.

Yet another significant aspect and feature of the present invention is the use of co-located louver panel view ports and overmold cavity view ports.

Yet another significant aspect and feature of the present invention is the use of overmold cavity view ports for protection of LED packages.

A still further significant aspect and feature of the present invention is a louver panel having intersecting angled surfaces on a support grid to provide rigidity and LED package protection.

Yet another significant aspect and feature of the present invention is the use of a louver panel having a support grid which acts to decrease visible module seams.

Another significant aspect and feature of the present invention is a louver panel having side, top and bottom panels forming a peripheral lip which extends over and about the frame and which snappingly engages the peripheral lip of the frame, as well as to positionally fix and capture the LED printed circuit board, the thermal conductive pad and the heat dissipation plate.

Another significant aspect and feature of the present invention is to provide even and effective cooling of electronic LED display modules which can be run in higher ambient temperatures without incurring heat related problems.

Another significant aspect and feature of the present invention is to provide a more efficient way of removing heat from components on the LED printed circuit board.

Another significant aspect and feature of the present invention is the use of a thermal conductive pad, a heat distribution plate and a plurality of heat sinks combined and secured to the back of LED printed circuit boards to draw heat off the back of LED printed circuit boards and to remove heat from components on the LED printed circuit board and evenly dissipate such heat across the entire volume of the LED display module.

Another significant aspect and feature of the present invention is the use of an internally located centrifugal air pump to provide fresh cooling air to the LED display module to forcibly draw heat from the combined thermal conductive pad, heat distribution plate and plurality of heat sinks and forcibly exhaust such heat externally.

Another significant aspect and feature of the present invention is the reduction in operating noise compared to the use of an air conditioning system with an LED display module.

Another significant aspect and feature of the present invention is the compact, low profile size ventilation system.

Another significant aspect and feature of the present invention is to promote airflow to take place over as much surface area of the LED display module as possible.

Another significant aspect and feature of the present invention is the incorporation of sealing and other features to eliminate EMI (electromagnetic interference).

Another significant aspect and feature of the present invention is the use of EMI paint over a rear cover, the frame or other components or molding EMI material into a rear cover, the frame or other components.

Another significant aspect and feature of the present invention is an LED electronic display module having EMI protection which is lighter than previous EMI protected LED electronic display modules.

Another significant aspect and feature of the present invention is the use of screens, or in the alternative, the use of screens having EMI protective material at an air intake enclosure and at a centrifugal air pump enclosure.

Another significant aspect and feature of the present invention is an LED display module which can easily include a variety of shapes that increases aesthetics, increases ease of handling, and that can have verbiage, directions, and logos easily inscribed on the surface thereof.

Having thus briefly described embodiments of the present invention and having mentioned some significant aspects and features of the present invention, it is the principal object of the present invention to provide an LED display module.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

Figure 1:
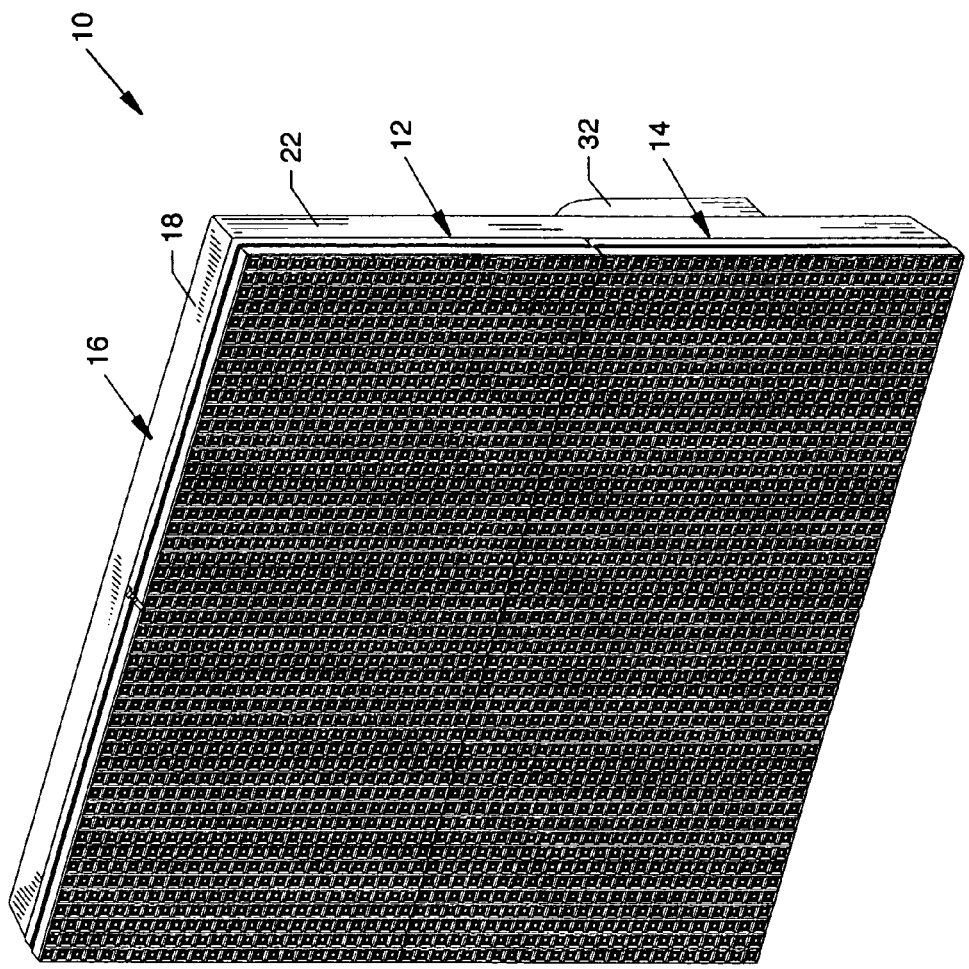
FIG. 1 is a front view of an LED display module, the present invention.
Figure 2:
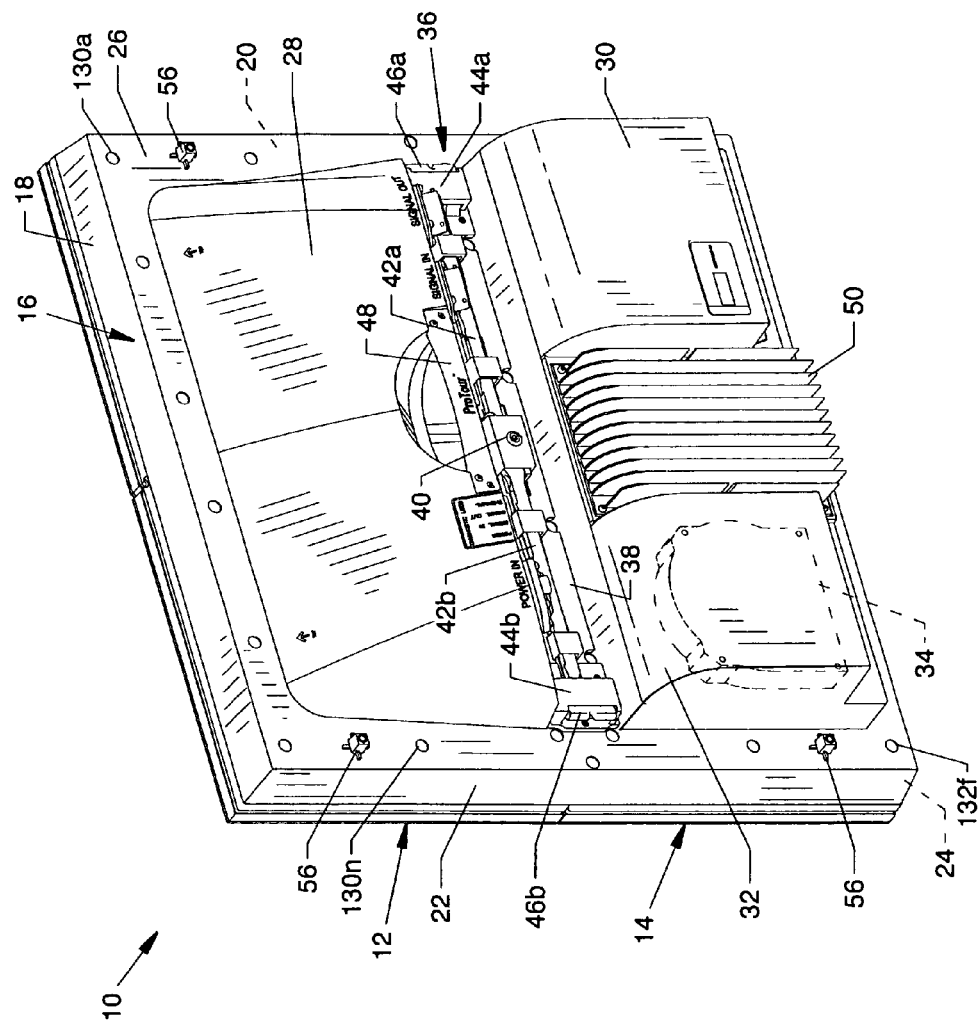
FIG. 2 is a rear view of the LED display module.

FIG. 1 is a front view of an LED (light emitting diode) display module 10, the present invention, and FIG. 2 is a rear view of the LED display module 10. Fully or partially visible components as shown in FIG. 1 and/or FIG. 2 include an upper LED display assembly 12, a lower LED display assembly 14, and a configured one-piece rear cover 16 made preferably from polycarbonate combined with EMI protective material. The rear cover 16 includes a top panel 18, opposed side panels 20 and 22, a bottom panel 24, a support panel 26 extending between the rear edges of the top panel 18, the opposed side panels 20 and 22, and the bottom panel 24, an enclosure panel 28 extending from the support panel 26, an air intake enclosure 30 extending from the support panel 26, and a centrifugal air pump enclosure 32 extending from the support panel 26 for housing an internally located centrifugal air pump 34. Also located at the rear of the support panel 26 is an LED display module latching system 36 transversely located upon the central portion of the support panel 26 incorporated to removably attach the other components of the LED display module 10 to a connector framework, such as described in patent application Ser. No. 11/271,404 filed Nov. 10, 2005, entitled "Stackable Electronic Sign System And Mounting Structures Therefor," which is pending, as well as being closely related to patent application Ser. No. 10/688,304 entitled "Electronic Display Module Having a Four-Point Latching System for Incorporation into an Electronic Sign and Process" filed Oct. 17, 2003. The LED display module latching system 36 includes a framework 38 and framework mounted components including, but not limited to, a centrally located actuator mechanism 40 which is accessible from the front or the back, opposed actuator arms 42a and 42b extending in opposite directions from and operated in opposing directions from and by the actuator mechanism 40, and latch housings 44a and 44b at the outer ends of the framework 38 for housing pivotable latches 46a and 46b which are pivotally operated by the outer ends of the actuator arms 42a and 42b, respectively. The pivotable latches 46a and 46b engage catches located at the forward edges of connector frameworks or other catch devices as referred to in the previously referenced patent applications. A handle 48 is also included at the lower portion of the enclosure panel 28. A heat sink 50 extends through the lower portion of the support panel 26 between the air intake enclosure 30 and the centrifugal air pump enclosure 32 with the aid of a gasket 52 (FIG. 3) to intimately contact and to draw heat from an electronics module 54 shown in FIG. 8. A plurality of alignment posts 56 extend rearwardly from the support panel 26 for alignment with connector frameworks.

Figure 3:
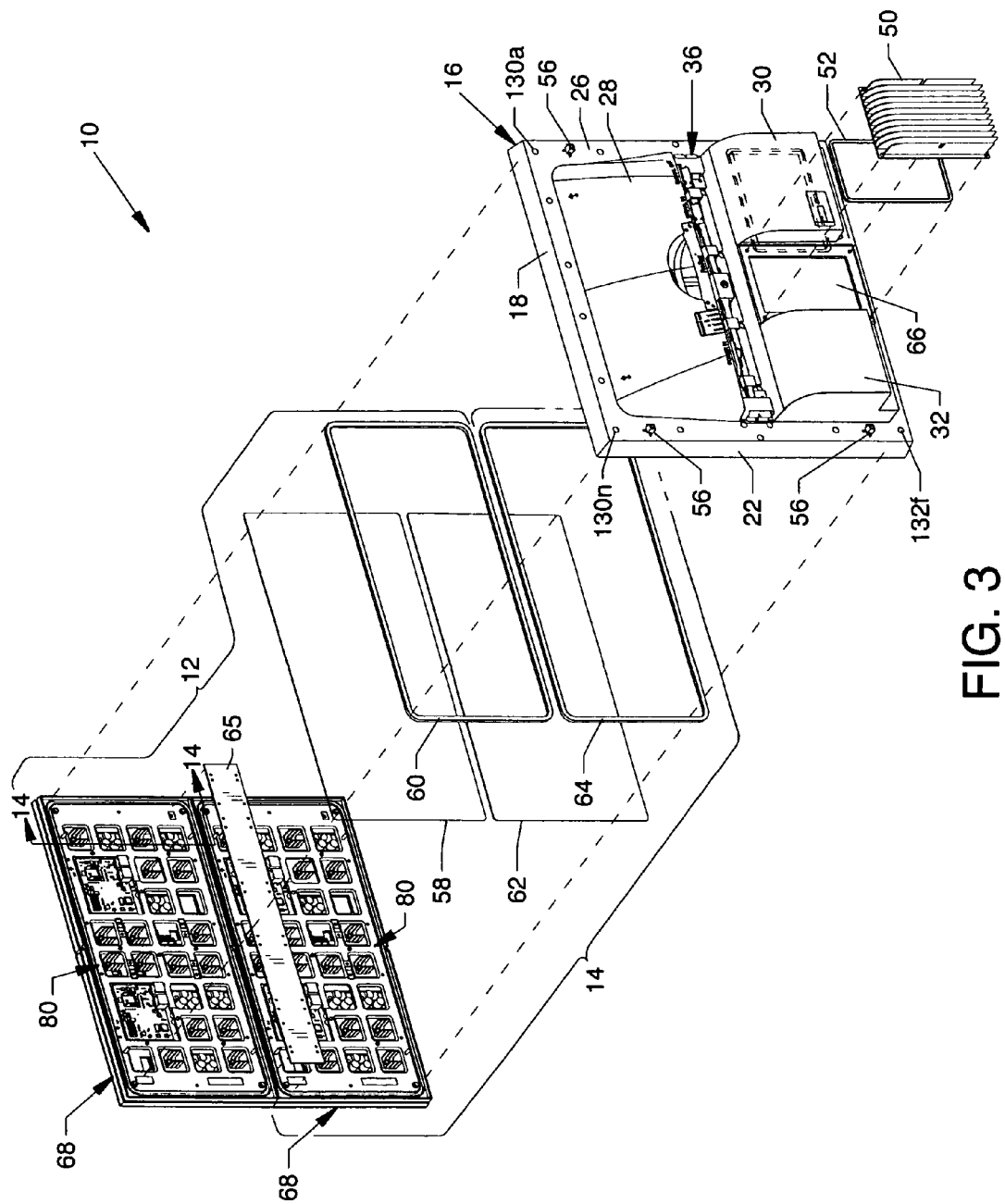
FIG. 3 is a semi-exploded rear view of the LED display module.

FIG. 3 is a semi-exploded rear view of the LED display module 10 showing the upper LED display assembly 12 which includes an upper weather seal 58 and a larger upper weather seal 60 and the lower LED display assembly 14 which includes a lower weather seal 62 and a larger lower weather seal 64, all of which components are shown separated and distanced from the rear cover 16. The upper weather seals 58 and 60 and the lower weather seals 62 and 64 seal against the upper LED display assembly 12 and the lower LED display assembly 14, respectively, in a double sealing arrangement involving the effecting of multiple seals with the rear cover 16. A connector plate 65 is secured to the frame 80 of the upper LED display assembly 12 and to the frame 80 of the lower LED display assembly 14, thereby connecting the upper LED display assembly 12 to the lower LED display assembly 14. The heat sink 50 and the weather seal 52 are shown in distanced alignment to an access opening 66 in the support panel 26 of the rear cover 16.

Figure 4:
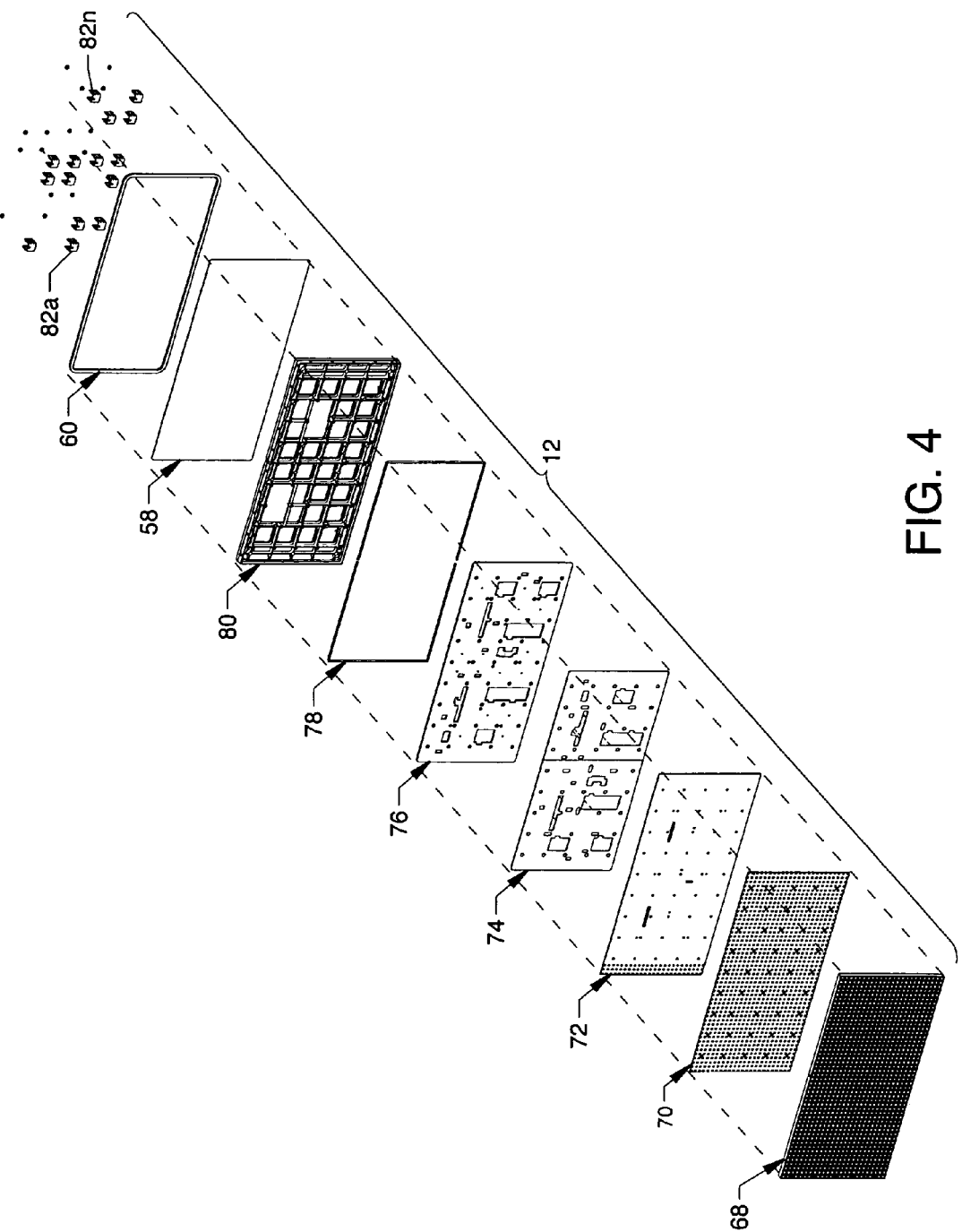
FIG. 4 is an exploded front view of the upper LED display assembly.
Figure 5:
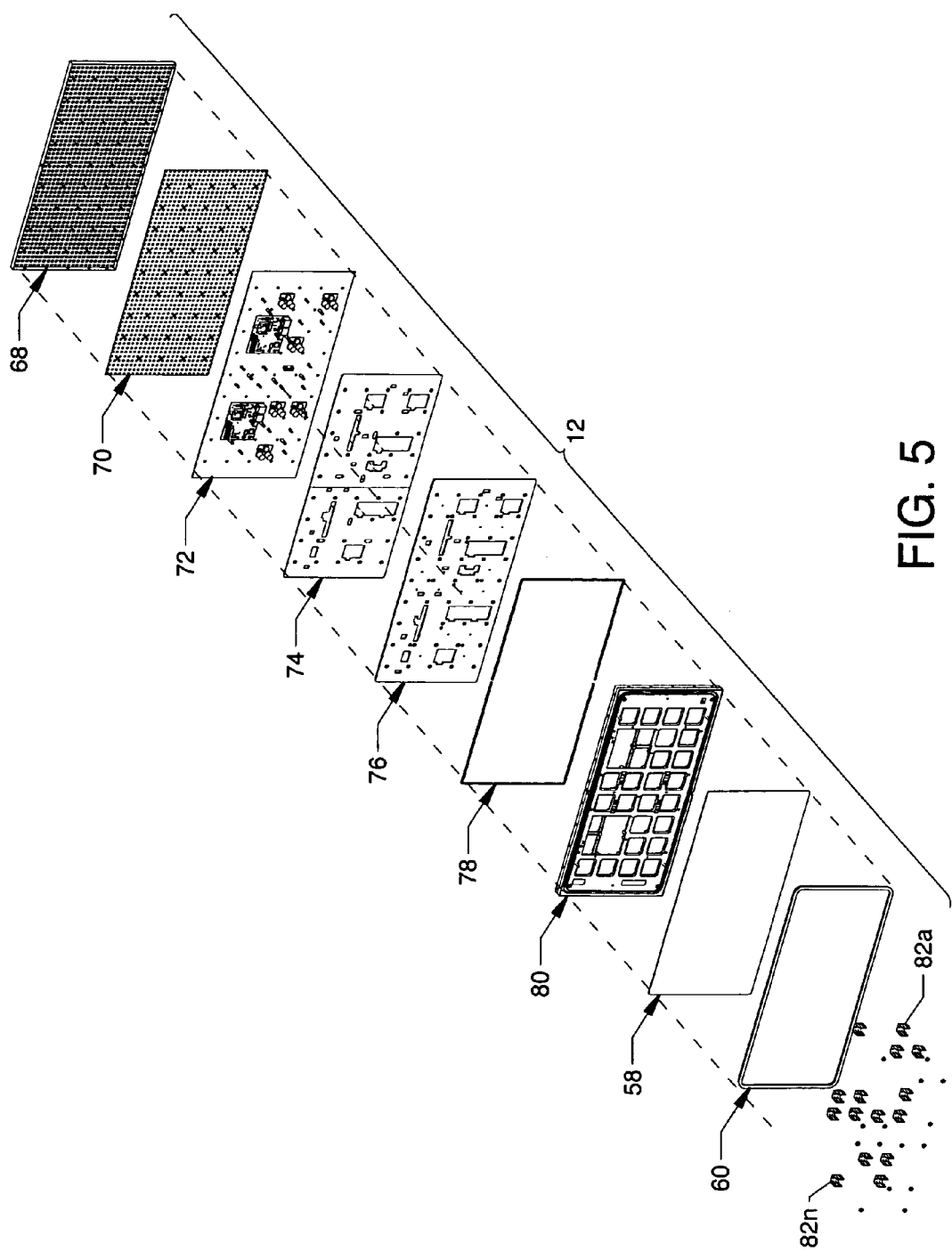
FIG. 5 is an exploded rear view of the upper LED display assembly.

FIG. 4 is an exploded front view of the upper LED display assembly 12, and FIG. 5 is an exploded rear view of the upper LED display assembly 12. The lower LED display assembly 14 is similar to the upper LED display assembly 12 and is not described separately for the purpose of brevity. The major components of the upper LED display assembly 12 include a louver panel 68 preferably of a dark contrasting color, an overmold panel 70 which is transparent or which can be translucent and which is later molded to but which is shown separately from the louver panel 68, an LED printed circuit board 72 (PCB) containing LED packages and other electronic components and associated features forming a unitary structure, as described later in detail, a thermal conductive pad 74, a heat distribution plate 76 preferably of aluminum or other highly heat conductive material which preferably is electrically conductive and grounded as an anti-EMI feature, a weather seal 78, a configured frame 80, a previously shown weather seal 58, a previously shown weather seal 60, and a plurality of heat sinks 82a-82n. Portions of the LED packages mounted on the printed circuit board 72 are shown at or near one vertical edge of the printed circuited board 72 for purposes of brevity and clarity. The overmold panel 70, the LED printed circuit board 72, the thermal conductive pad 74, the heat distribution plate 76 and the weather seal 78 are intimately and closely assembled and forcibly held and contained within forward facing cavity 142 (FIG. 7) of the configured frame 80 by the louver panel 68, the assembly of which is shown in FIG. 3, and which is also shown in cross section in FIG. 13. The previously described weather seals 58 and 60 (FIG. 3) interface between the rear portion of the frame 80 in a double sealing arrangement with structure of the rear cover 16, as do weather seals 62 and 64 with respect to the lower LED display assembly 14.

Figure 6:
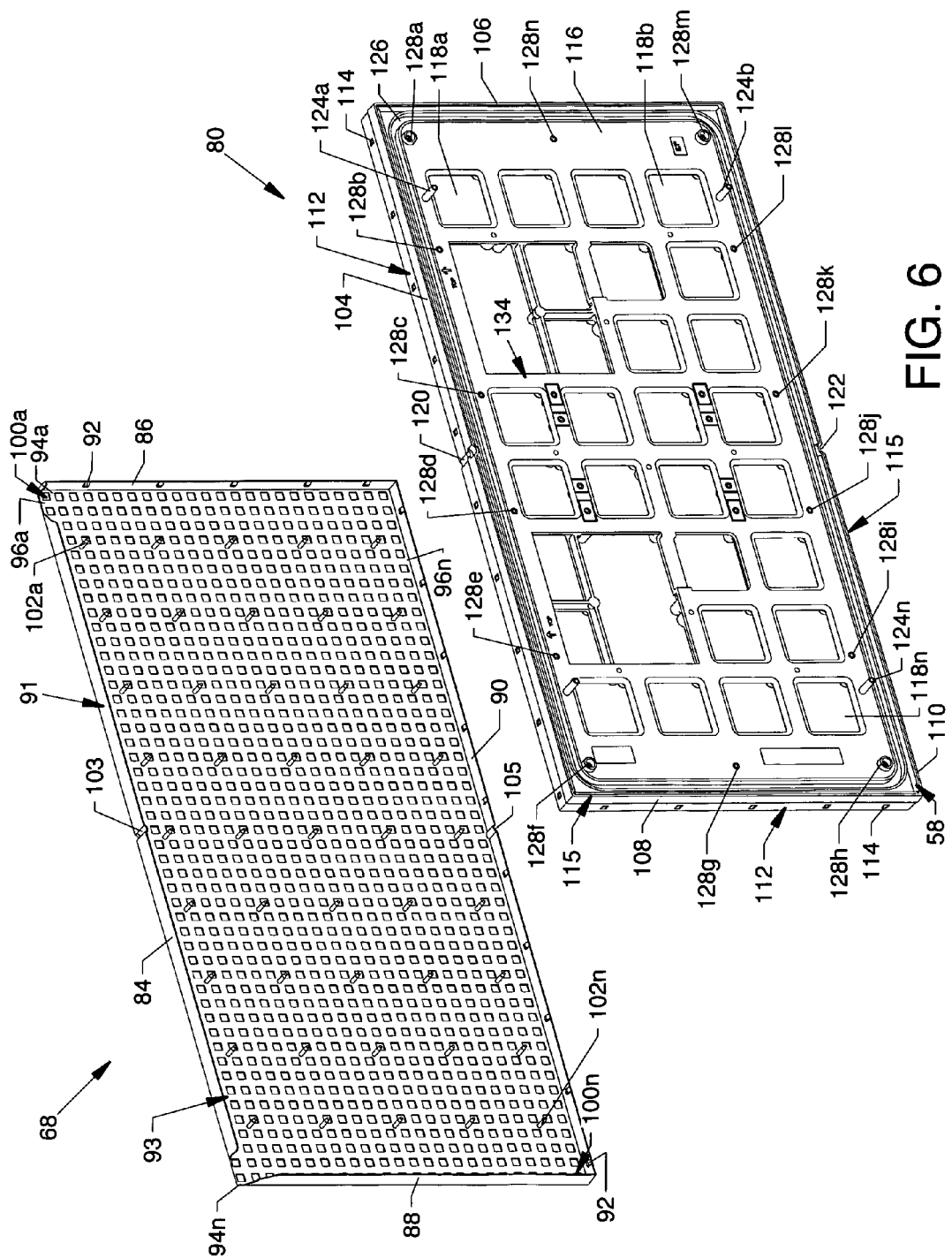
FIG. 6 is a rear view of a louver panel distanced from a frame.
Figure 10:
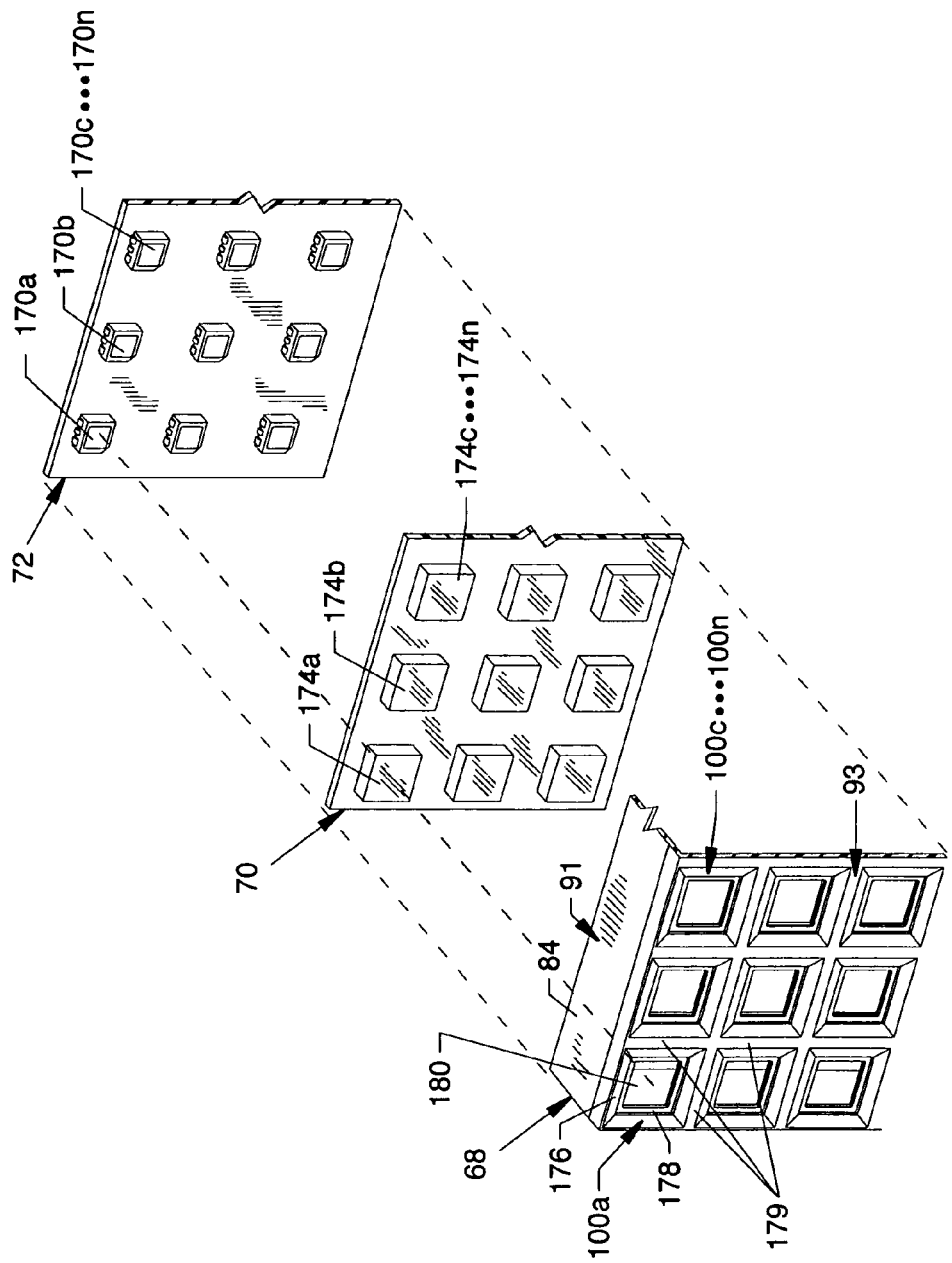
FIG. 10 is an exploded partial front view of some components of the LED display assembly comprising the upper left corner of the louver panel showing a partial front view of components located in close relationship to the louver panel.
Figure 11:
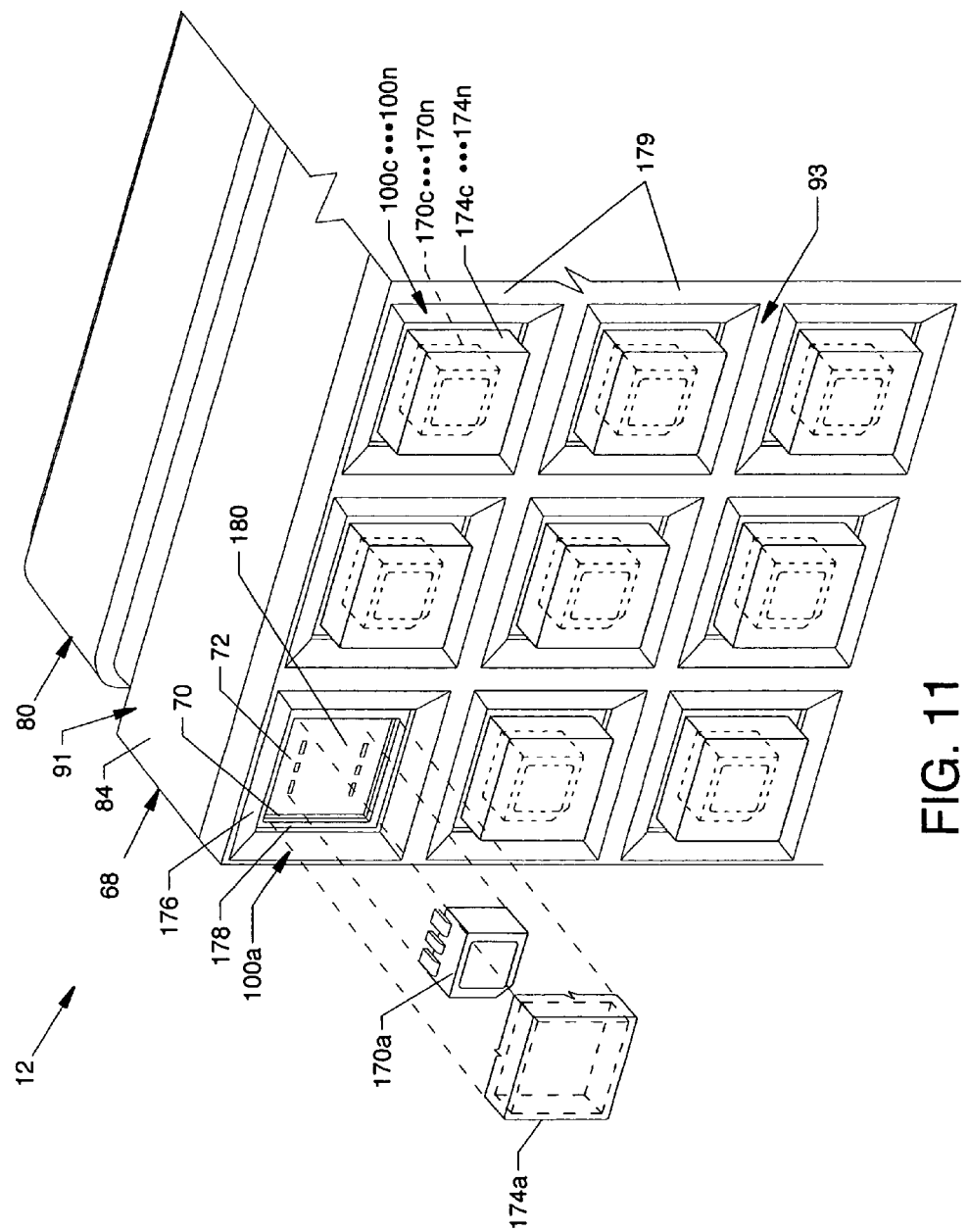
FIG. 11 is an assembled partial view and partially exploded view incorporating many of the components of FIG. 10.

FIG. 6 is a rear view of the louver panel 68, shown in cutaway view, distanced from the frame 80 which is also shown as a rear view. The louver panel 68 includes a top panel 84, a side panel 86, a side panel 88, and a bottom panel 90, as well as other components as described herein. The interior surfaces of the top panel 84, the side panel 86, the side panel 88, and the bottom panel 90 include a plurality of spaced latches 92, each having one or more sloped surfaces distributed along and thereabout, whereby each of the latches 92 is raised above and extends inwardly from the respective interior surface. A support grid 93 is formed of a plurality of vertical aligned supports 94a-94n extending between the top panel 84 and the bottom panel 90 which mutually and multiply intersect a plurality of horizontally aligned supports 96a-96n extending between the side panel 86 and the side panel 88 substantially delineating and supporting a plurality of louver panel view ports 100a-100n extending therethrough and being arranged in grid fashion. The louver panel 68 can be formed of any suitable plastic or other material and can be coated preferably with a low reflection paint in order to inhibit a shiny or reflective quality and to improve contrast. In the alternative, the louver panel can be formed of surfaces which are nonreflective in nature. A feature, such as stippling, etching, or the like, can be used in order to reduce a reflective glare. LED packages 170a-170n (FIG. 10) are aligned in close relationship to the rear of the louver panel view ports 100a-100n, whereby such LED packages are visible through features of the transparent overmold panel 70 (FIG. 11) which is aligned with and intimately engages the support grid 93 surrounding the louver panel view ports 100a-100n, as described later in detail. The front of the one-piece louver panel 68, as shown in FIGS. 10 and 11, includes the front portion of the support grid 93 which collectively surrounds the front of each of the surrounding louver panel view ports 100a-100n, as well as overmold cavity view ports 174a-74n of the overmold panel 70 which extend through the louver panel view ports 100a-100n. The collective front surface portions of the support grid 93 surrounding each of the surrounding louver panel view ports 100a-100n are angled to form a plurality of louvers for the purpose of protection of LED packages and for shading of the LED packages, as described later in detail. A plurality of engagement pins 102a-102n are located at and extend rearwardly from various locations on the support grid 93. The engagement pins 102a-102n align and extend through the overmold panel 70, the LED printed circuit board 72 and some closely associated components thereof, the thermal conductive pad 74, the heat distribution plate 76, and also align with, extend into and engage pin receiver posts 140a-140n (FIG. 7) located in the front facing portion of the frame 80. Opposed semi-circular notches 103 and 105 are included in the top panel 84 and the bottom panel 90, respectively, for alternate operation of the LED display module latching system 36 (FIG. 2) through adjacent stacked upper and lower LED display assemblies 12 and 14, respectively, as applicable.

Figure 7:
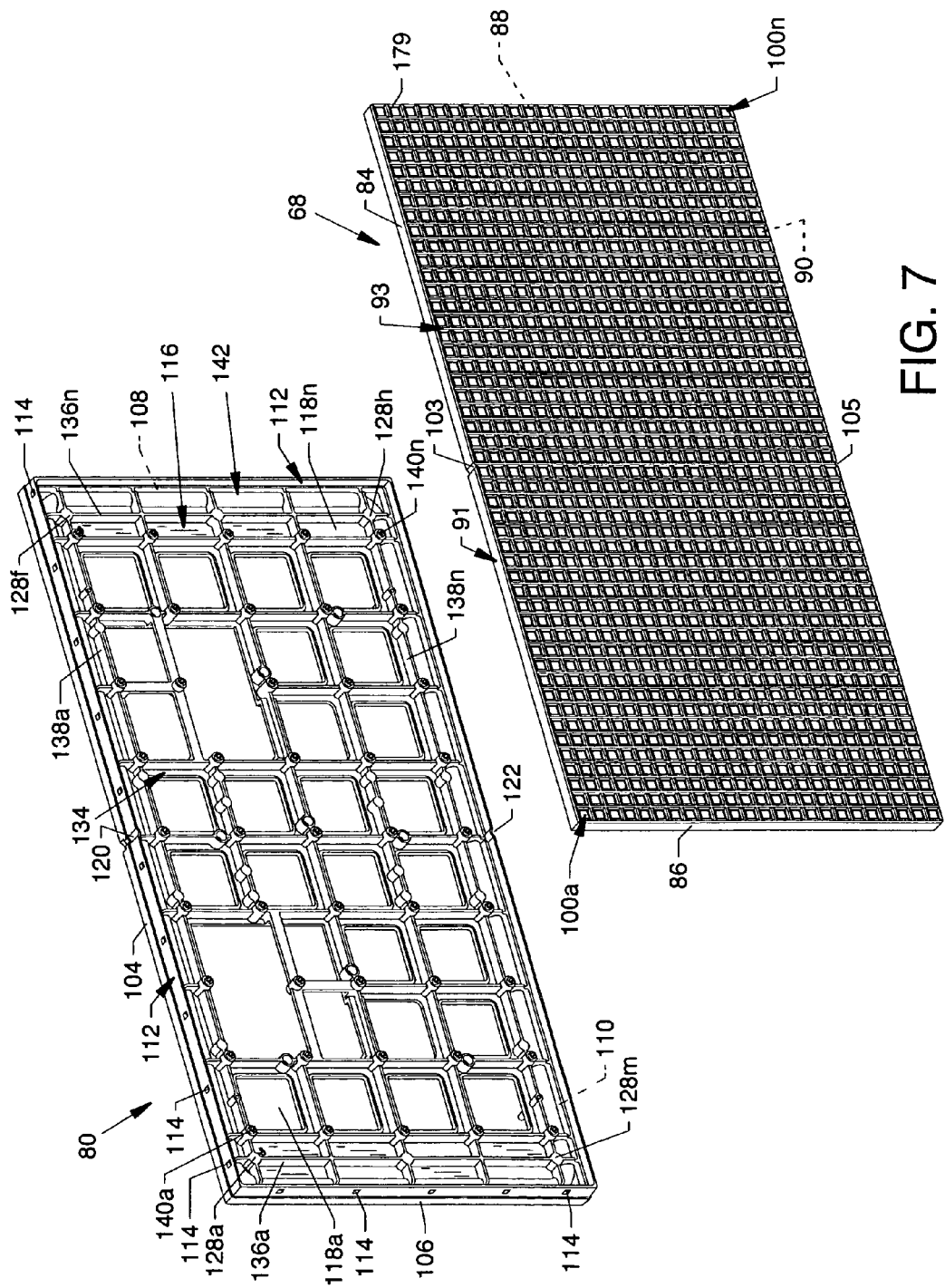
FIG. 7 is a front view of the louver panel distanced from the frame.

As also shown in FIG. 7, the frame 80 includes a top panel 104, a side panel 106, a side panel 108, and a bottom panel 110, as well as other components as described herein. A continuous peripheral lip 112 extends rearwardly from the top panel 104, the side panel 106, the side panel 108, and the bottom panel 110, and includes a plurality of catches 114 (also shown in FIG. 9) distributed along and about the outer surfaces of the peripheral lip 112 where each catch 114 is in the form of an inwardly extending cavity having one or more sloped surfaces. Additionally and collectively, the top panel 104, the side panel 106, the side panel 108, and bottom panel 110 of the frame 80 include a forwardly extending peripheral lip 115 for mating with a segmented peripheral outer lip 148 (FIGS. 8, 12 and 13) of the rear cover 16. A central panel 116 (FIGS. 7 and 14) extends between the top panel 104, the side panel 106, the side panel 108, and the bottom panel 110, and is interrupted by a plurality of openings 118a-118n through which components extend or through which access cable connections and the like are available. Opposed semi-circular notches 120 and 122 (FIG. 7) are included in the top panel 104 and the bottom panel 110, respectively, for alternate operation of the LED display module latching system 36 (FIGS. 2, 3 and 15) through adjacent stacked upper and lower LED display assemblies 12 and 14, respectively, as applicable. A plurality of pins 124a-124n (FIGS. 6 and 14) extend rearwardly from the central panel 116 some of which can be accommodated by a connector plate 65, shown in FIG. 3. A continuous weather seal channel 126 (FIGS. 12, 13 and 14) is located near the periphery of the central panel 116 and just inboard of the top panel 104, the side panel 106, the side panel 108, and the bottom panel 110 for sealed accommodation of the weather seal 60 between the frame 80 and the rear cover 16. A plurality of recessed threaded inserts 128a-128n (FIG. 7) are suitably secured along and about the periphery of the central panel 116 (FIG. 7) to receive fasteners, preferably screws, which are incorporated in cooperation with fastener housings 130a-130n or 132a-132n located in the rear cover 16 (FIG. 8) to secure the rear cover 16 and components located on the rear cover 16 to the frame 80 of the upper LED display assembly 12 and to the frame 80 of the lower LED display assembly 14. The upper LED display assembly 12 and the lower LED display assembly 14 are interchangeable.

Figure 13:
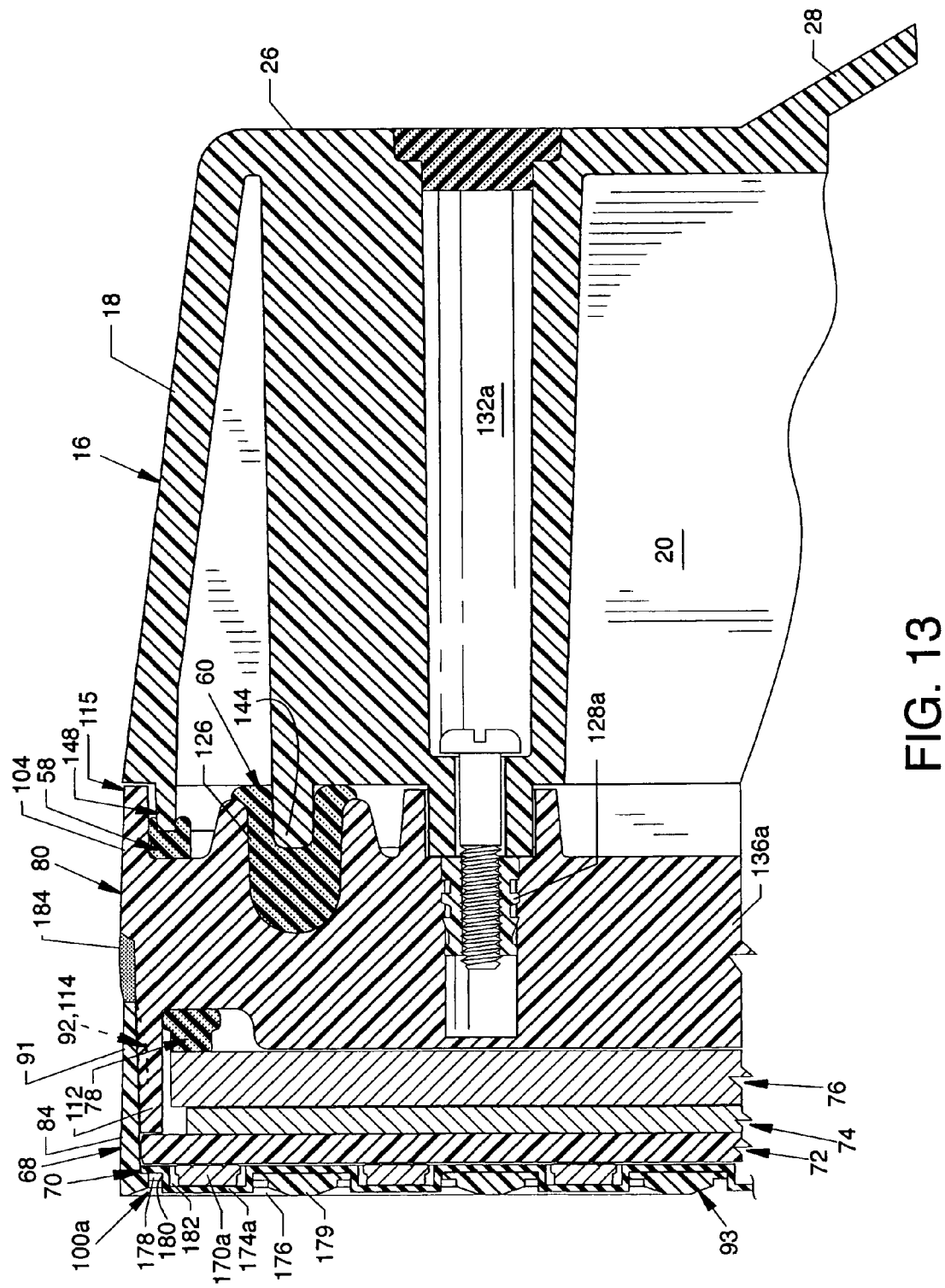
FIG. 13 is an assembled view of the components of FIG. 12.

FIG. 7 is a front view of the louver panel 68 distanced from the frame 80 also shown as a front view. Shown in general in the louver panel 68 is the location of the view ports 100a-100n on the front portion thereof. Structure of the frame 80 is also shown including a support grid 134 formed by a plurality of vertically aligned supports 136a-136n extending between the top panel 104 and the bottom panel 110 and along various portions of the central panel 116, and a plurality of horizontally aligned supports 138a-138n extending between the side panel 106 and the side panel 108 and along various portions of the central panel 116 which supports mutually intersect and which are in close association with the plurality of the various shaped openings 118a-118n. The plurality of forwardly facing pin receiver posts 140a-140n are located at many of the intersections of the vertically aligned supports 136a-136n and the horizontally aligned supports 138a-138n to accommodate and frictionally engage the engagement pins 102a-102n (FIG. 6) of the louver panel 68. The expansive cavity 142 accommodates the closely associated overmold panel 70, the LED printed circuit board 72, the thermal conductive pad 74, the heat distribution plate 76, and the weather seal 78, and is bounded in general by the peripheral lip 112, by the forward facing edges of the support grid 134, and by the forward facing portions of the pin receiver posts 140a-140n. The louver panel 68, including the closely associated overmold panel 70, is incorporated to contain the LED printed circuit board 72, the thermal conductive pad 74, the heat distribution plate 76, and the weather seal 78 within the cavity 142, whereby the engagement pins 102a-102n of the louver panel 68 extend through the overmold panel 70, the LED printed circuit board 72, the thermal conductive pad 74, and the heat distribution plate 76 to frictionally engage the receiver posts 140a-140n of the frame 80. Simultaneously, the top panel 84, the side panels 86 and 88, and the bottom panel 90 of the louver panel 68, which form the peripheral lip 91, closely engage over and about and are brought into intimate contact with the peripheral lip 112 of the frame 80 during which time the latches 92 of louver panel 68 snappingly engage the catches 114 of the frame 80 to complete yet another method of fastening, in addition to the first method of fastening involving the engagement of engagement pins 102a-102n of the louver panel 68 within the pin receiver posts 140a-140n of the frame 80. The described mating of the louver panel 68 with the frame 80 with the addition of a suitable bead of weatherproof sealant or adhesive 184 about the already tightly configured joinment, as shown in FIG. 13, offers weatherproofing between the louver panel 68 and the frame 80, thereby protecting the components enclosed therein. Weatherproofing between the louver panel 68 and the LED printed circuit board 72 and the closely associated thermal conductive pad 74 and the heat distribution plate 76 is provided by the overmold panel 70, as described later in detail.

Figure 8:
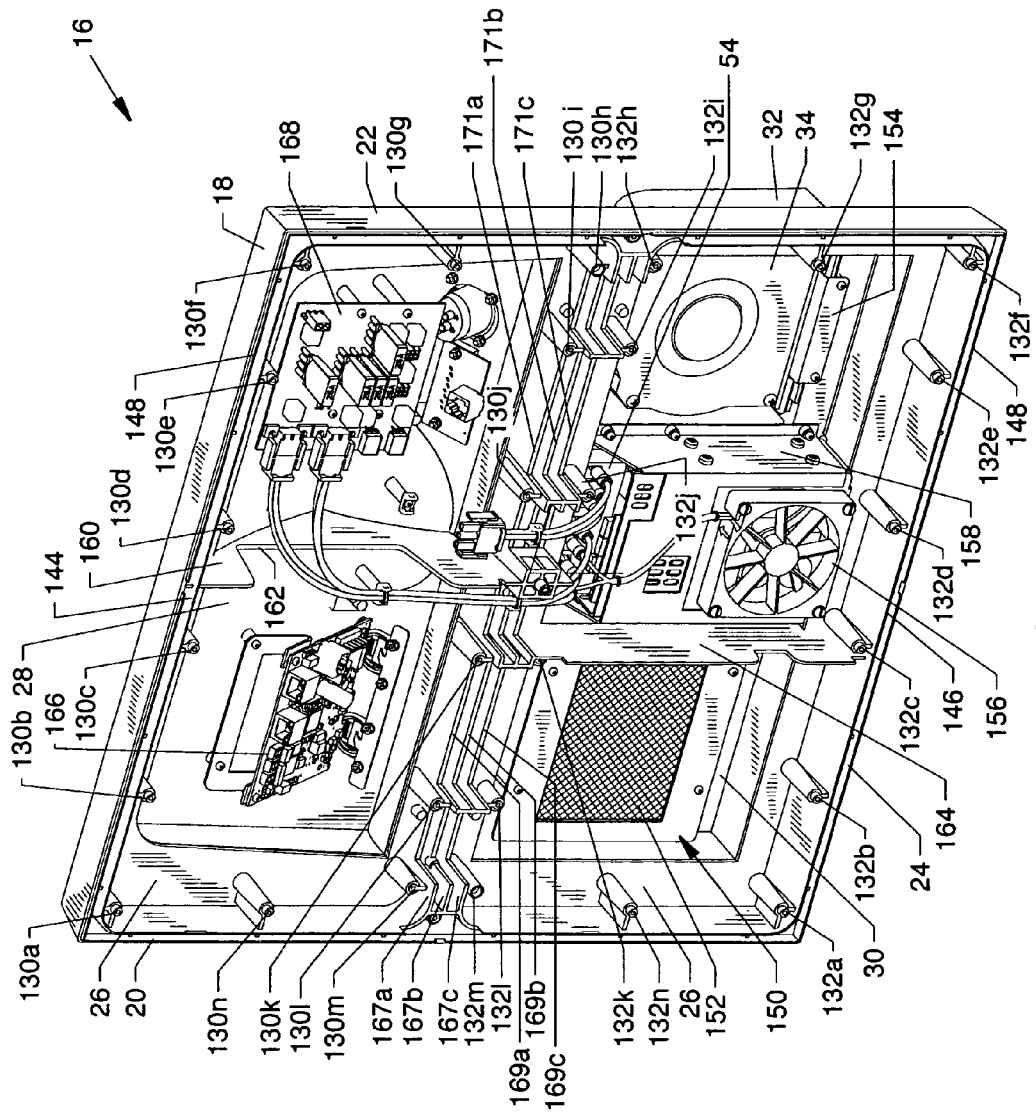
FIG. 8 is a front view of a rear cover.
Figure 12:
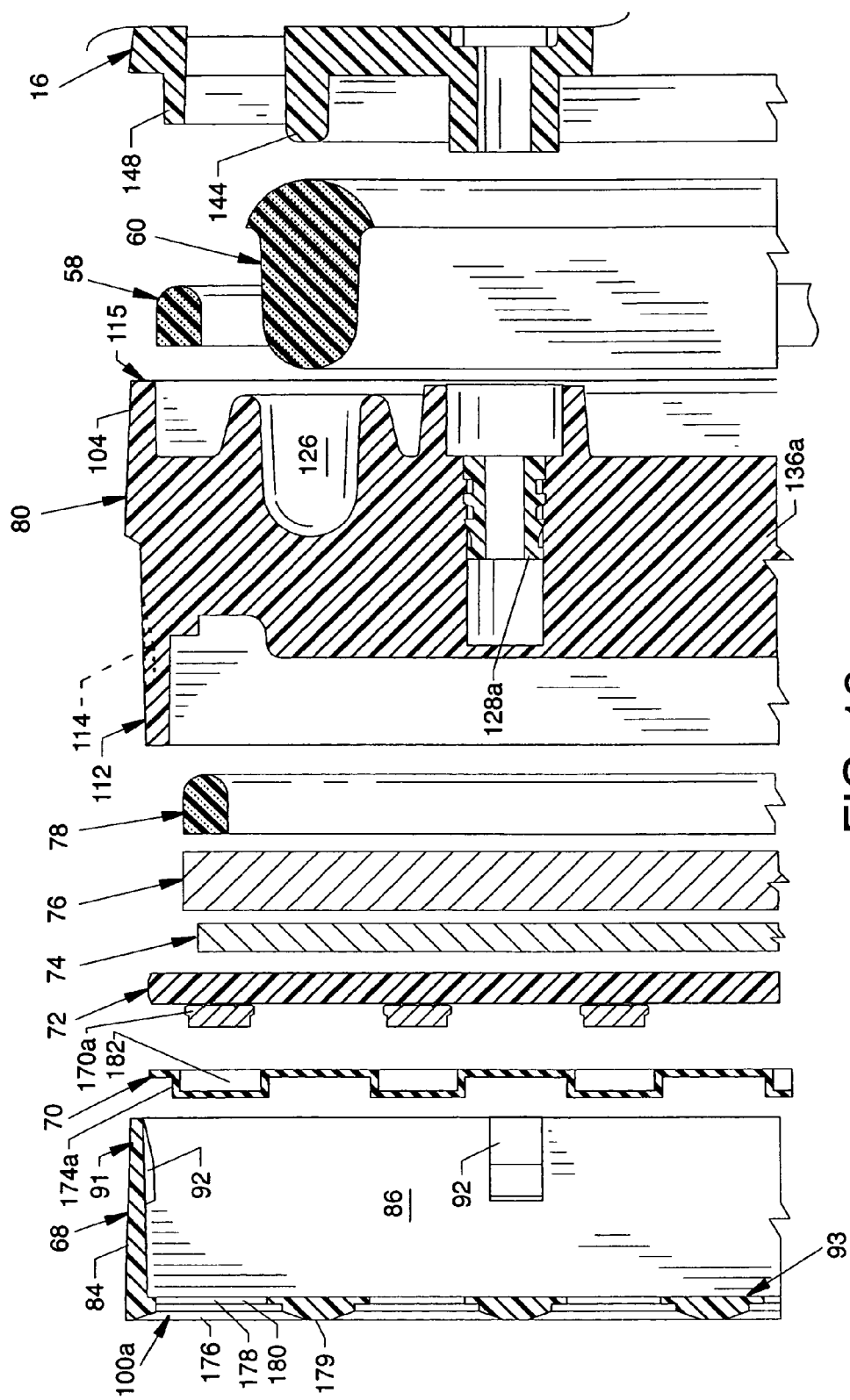
FIG. 12 is an exploded and partial view showing some of the components closely associated with the upper left corner of the LED display assembly and in close relationship to the louver panel.

FIG. 8 is a front view of the rear cover 16. The pluralities of fastener housings 130a-130n and 132a-132n are shown extending forwardly from the support panel 26. A continuous inner lip 144 extends forwardly from the support panel 26 in a parallel and spaced relationship with the upper portion of the side panel 20, with the top panel 18, and with the upper portion of the side panel 22, and is supportingly connected to the fastener housings 130a-130h and 130m-130n and to the upper portion of the side panel 20, the top panel 18, and the upper portion of the side panel 22. In a similar fashion, another continuous inner lip 146 extends forwardly from the support panel 26 in a parallel and spaced relationship with the lower portion of the side panel 20, with the bottom panel 24, and with the lower portion of the side panel 22, and is supportingly connected to the fastener housings 132a-132h and 132m-132n and to the lower portion of the side panel 20, the bottom panel 24, and the lower portion of the side panel 22. A segmented peripheral outer lip 148 extends forwardly along, about and from the top panel 18, the side panels 20 and 22, and the bottom panel 24. The inner lip 144 intimately and sealingly engages the weather seal 60 and in a similar fashion the inner lip 146 intimately and sealingly engages the weather seal 64 as shown in FIGS. 12 and 13. Corresponding portions of the segmented peripheral outer lip 148 intimately and sealingly engage major portions of the weather seals 58 and 62.

A filter assembly 150, including a framed filter 152 consisting of mesh-like metal screen or EMI protective screen material or other such suitable material containing EMI protective material, is located in the air intake enclosure 30 to inhibit EMI emissions. Also visible is the centrifugal air pump 34 residing in the centrifugal air pump enclosure 32. The front edge of a framed filter 154 having a mesh-like metal screen or EMI protective screen material or other such suitable material containing EMI protective material is visible just below the centrifugal air pump 34. The framed filter 152 and the framed filter 154 are also useful for excluding insects from the interior of the LED display module 10.

A cooling fan 156 mounts to an enclosure 158 which surrounds the electronics module 54. Provision is also made for dedicated and directed air flow along and about the interior of the LED display module 10 incorporating a plurality of configured panels where some have air passage cutouts for managing airflow. A vertically oriented panel 160 including an air passage cutout 162 extends outwardly from the enclosure panel 28 and another vertically oriented panel 164 located adjacent to the air intake enclosure 30 extends outwardly from the support panel 26. A plurality of horizontally oriented support panels 167a-167c extend substantially between the opposed sides 20 and 22 and along the support panel 26 to act as support structure for the LED display module latching system 36 and conveniently include interrupted air passage cutouts 169a, 169b and 169c located in close proximity to the fastener housings 130k, 130l, 130m, 132k, 132l and 132m, and also include interrupted air passage cutouts 171a, 171b and 171c located in close proximity to the fastener housings 130h, 130i, 130j, 132h, 132i and 132j to assist in cooling air flow from an air intake enclosure inlet 190 (FIG. 16), through the air intake enclosure 30, through the framed filter 152, through the air passage cutouts 169a, 169b and 169c, through the upper part of the rear cover 16 containing an electronic assembly 166, through the passage cutout 162, through the upper part of the rear cover 16 containing an electronic assembly 168, through the air passage cutouts 171a, 171b and 171c, and through the centrifugal air pump 34 and the framed filter 154, and thence overboard through an centrifugal air pump enclosure outlet 194 (FIGS. 15 and 16) in the centrifugal air pump enclosure 32. Such dedicated and directed airflow is also shown and described in FIG. 17.

Figure 9:
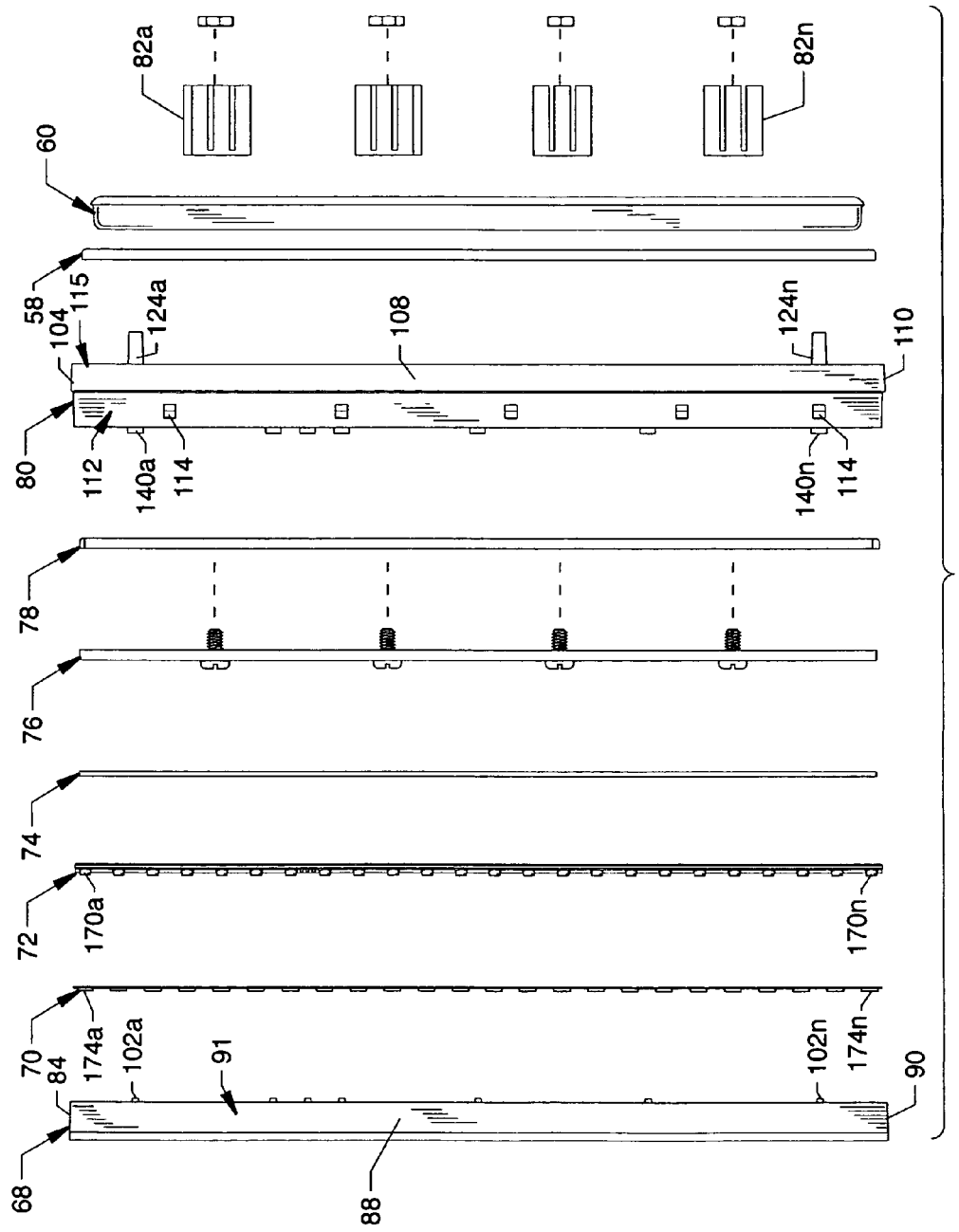
FIG. 9 is an exploded side view of the upper LED display assembly showing the alignment of the components forming the LED display assembly.

FIG. 9 is an exploded side view of the upper LED display assembly 12 showing the alignment of the components forming the LED display assembly 12.

FIG. 10 is an exploded partial view of some components of the LED display module 12 comprising the upper left corner of the louver panel 68 showing a partial view of components located in close relationship to the louver panel 68, including, but not limited to, the overmold panel 70, the LED printed circuit board 72, and other components or features closely related thereto. FIG. 11 is an assembled partial view and partially exploded view incorporating many of the components of FIG. 10 showing part of the louver panel 68, some of the view ports 100a-100n, a portion of the support grid 93, a portion of the overmold 70, an LED package 170a shown distanced from the LED printed circuit board 72 and the view port 100a, and an overmold cavity 174a separated from and distanced from the underlying overmold panel 70. Part of the frame 80 is also shown. With reference to FIG. 10 and/or FIG. 11, such components or features are now described. The LED printed circuit board 72 includes a plurality of forwardly oriented LED packages 170a-170n, preferably surface mounted LED packages, mounted thereto. The LED packages 170a-170n can include one or more internally located LEDs, preferably of different colors, where there are multiple LEDs incorporated. Preferably, the body of the LED packages 170a-170n, with the exception of the front portion which can be clear or translucent, is of a dark color, such as black, in order to contribute to display contrast and to minimize lateral light transmission. The transparent overmold panel 70 includes a plurality of forward extending overmold cavity view ports 174a-174n which are open to the rear to closely accommodate the forward portion of the plurality of LED packages 170a-170n for viewing therethrough. The general and planar structure of the overmold panel 70 is molded to the rear support grid 93 of the louver panel 68, whereby the overmold cavity view ports 174a-174n extend through and project outwardly from and are viewable through the louver panel view ports 100a-100n. The overmold cavity view ports 174a-174n are slightly smaller than the dimension of an opening 180 (FIG. 10) of the continuous sub-lip 178 central to the louver panel view ports 100a-100n, each being correspondingly co-located within the support grid 93. A continuous angled surface 176 including four angled portions is located on the forward facing portion of the support grid 93, whereby each continuous angled surface 176 forms part of each of the individual louver panel view ports 100a-100n. The continuous sub-lip 178, being part of and continuous with the support grid 93, forms part of each of the individual louver panel view ports 100a-100n and extends inwardly from the inner periphery of each of the continuous angled surfaces 176 to create the opening 180 through which a greater part of the co-located LED packages 170a-170n and the overmold cavity view ports 174a-174n extend. The continuous angled surface 176, the sub-lip 178, and the opening 180 together form units of the louver panel view ports 100a-100n. Both the overmold cavity view ports 174a-174n and the louver panel view ports 100a-100n are visible along the support grid 93, whereby the overmold cavity view ports 174a-174n are viewable within the louver panel view ports 100a-100n. Also, the combination of multiple angled surfaces 176 distributed along and about the front portion of the support grid 93, along with the support grid 93, forms a plurality of substantially similar louvers 179 distributed along and about the louver panel 68 for the purpose of physical and light shading protection of the LED packages 170a-170n, as well as providing the same protective features for the overlying co-located overmold cavities view ports 174a-174n.

FIG. 12 is an exploded view of some components closely associated with the upper left corner of the louver panel 68 showing a partial view of such components located in close relationship to the louver panel 68. Shown in particular and substantially in two illustrations is the summary of relationships of multiple components which are in forced intimate contact to create suitable weather seals between the louver panel 68 to the rear cover 16. FIG. 13 is an assembled view of the components of FIG. 12. The components are brought together in a forcible fashion by the use of suitable fasteners, such as, but not limited to, screws and the like to cause intimate contact of various sealing surfaces or components. Also shown in particular is the relationship of the LED packages 170a-170n with a plurality of rearwardly facing openings 182 located within the overmold cavity view ports 174a-174n.

One region of sealing is located between the louver panel 68 and the overmold panel 70. More specifically, the generally planar forward portion of the overmold panel 70 intimately and forcibly contacts the rear portion of the support grid 93 and the continuous sub-lip 178 which are unitary in nature, thereby creating a seal there between.

Another region of sealing is located between the overmold panel 70 and the LED printed circuit board 72. More specifically, the generally planar rearward portion of the overmold panel 70 intimately and forcibly contacts the LED printed circuit board 72 creating a seal therebetween to effectively seal the LED packages 170a-170n between the overmold panel 70, including the overmold cavity viewports 174a-174n, and the LED printed circuit board 72.

Another region of sealing is located between the rear of the heat distribution plate 76 and the frame 80. More specifically, the weather seal 78 is located between the rearward facing portion of the heat distribution plate 76 and the forward facing perimeter of the frame 80 just inside the peripheral lip 112 in intimate and forced contact therebetween.

Another region of sealing is located between the louver panel 68 and the frame 80. More specifically, the peripheral lip 91 formed by the combined top panel 84, the side panels 86 and 88, and the bottom panel 90 of the louver panel 68 intimately, forcibly, overlappingly contacts and mutually engages the peripheral lip 112 of the frame 80, whereby the latches 92 of the peripheral lip 91 of the louver panel 68 intimately and forcibly engage the catches 114 of the frame 80 in an interlocking relationship. Further sealing is accomplished by the addition of a suitable sealant 184 applied at the junction of the peripheral lip 112 and the peripheral lip 91 as shown in FIG. 13.

A region of double sealing, incorporating an intimate forcible contact, is located between the rear of the frame 80 and the front of the rear cover 16. More specifically, an outer sealing relationship is provided by the weather seals 58 and 62 located between the rearward facing portion of the frame 80 just inside of the continuous peripheral lips 115 and the segmented peripheral outer lip 148 of the rear cover 16. An inner sealing relationship is provided by the weather seals 60 and 64 which reside in the weather seal channels 126 of the frame 80 and the inner lip 144, as well as the inner lip 146 of the upper and lower frames 80, respectively.

Figure 14:
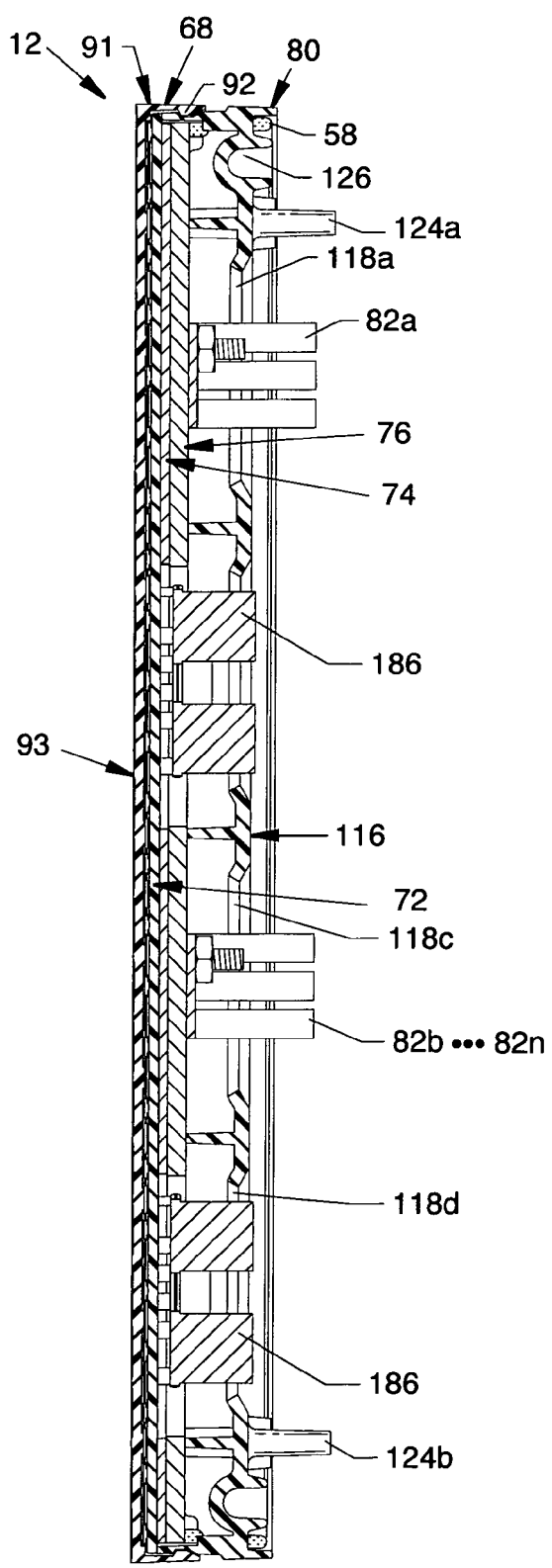
FIG. 14 is a cross section view of the upper LED display module along line 14-14 of FIG. 3 showing the close and intimate relationship of the heat sinks to the heat distribution plate, the thermal conductive pad, and the LED printed circuit board.

FIG. 14 is a cross section view of the upper LED display module 12 along line 14-14 of FIG. 3 showing the close and intimate relationship of the heat sinks 82a-82n to the heat distribution plate 76, the thermal conductive pad 74, and the LED printed circuit board 72. Such an arrangement conducts and wicks heat from a plurality of various electronic components 186 secured to the LED printed circuit board 72, from the plurality of LED packages 170a-170n and from the LED printed circuit board 72 through the thermal conductive pad 74 and the heat distribution plate 76 to the plurality of heat sinks 82a-82n. The heat received by the plurality of heat sinks—82a-82n is then dissipated with an evenly improved efficacy as provided by the airflow throughout the interior of the LED display module 10, as later described in detail herein.

Figure 15:
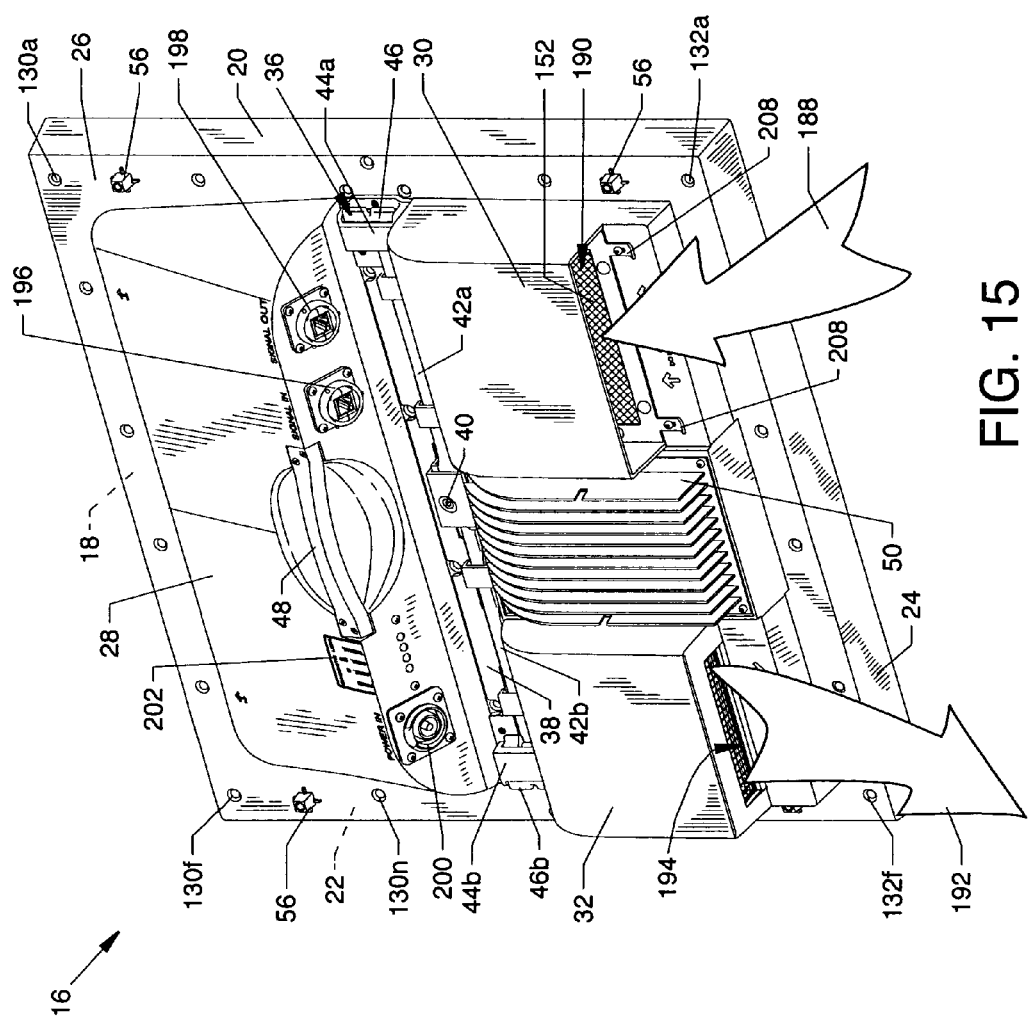
FIG. 15 is a rear view of the rear cover showing the lower structures of the air intake enclosure and the centrifugal air pump enclosure.

FIG. 15 is a rear view of the rear cover 16 showing the lower structure of the air intake enclosure 30 and the centrifugal air pump enclosure 32. Cooling air 188 is drawn by action of the centrifugal air pump 34 through the air intake enclosure inlet 190 and circulated along a dedicated path within the LED display module 10 to absorb generated interior heat which is then forced outwardly as exhaust air 192 at an elevated temperature through the centrifugal air pump enclosure outlet 194. Additional interior air flow is shown in FIG. 17.

The lower portion of the enclosure panel 28 serves as a mount and for accommodating a signal input receptacle 196, a signal output receptacle 198, a power receptacle 200, and for a diagnostic display 202.

Figure 16:
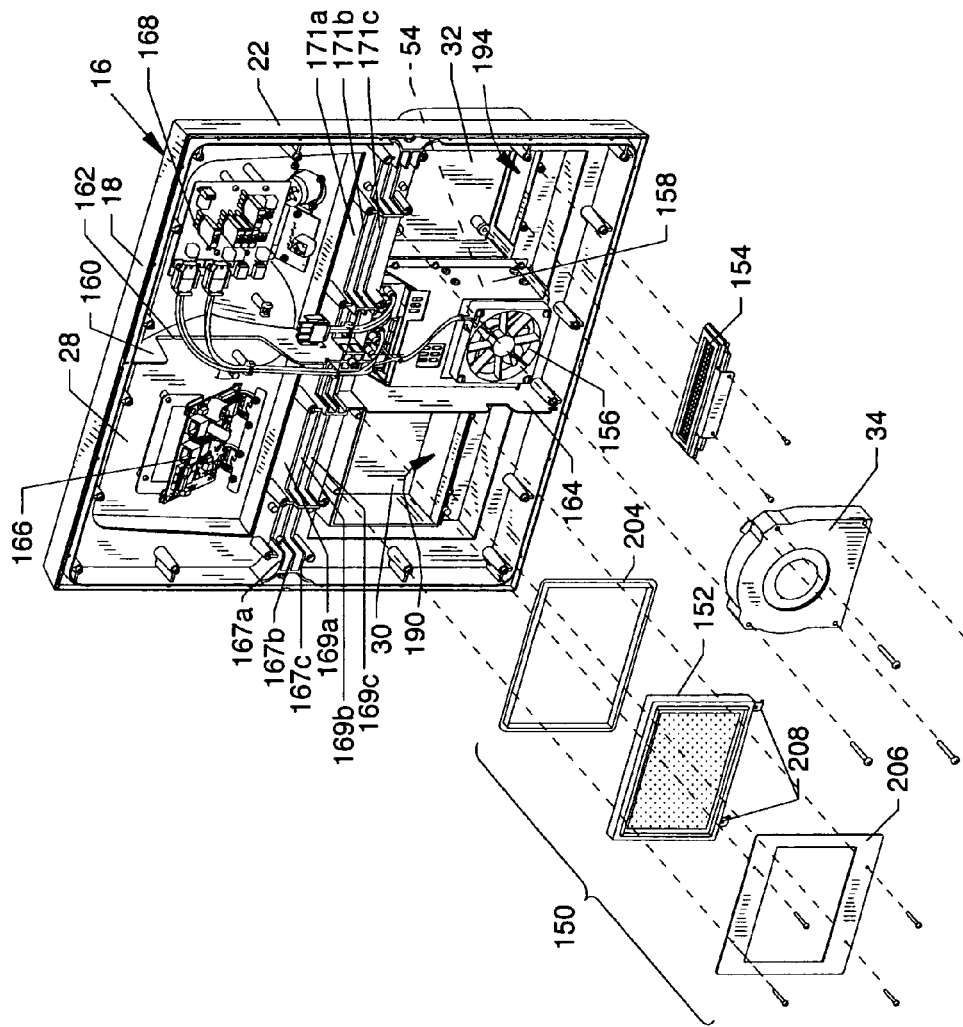
FIG. 16 is an exploded front view of the rear cover showing the filter assembly, the centrifugal air pump, the framed filter and associated components distanced from the rear cover; and, FIG. 17 shows the rear cover of the LED display module showing airflow along the inner regions and components thereof.

FIG. 16 is an exploded front view of the rear cover 16 showing the filter assembly 150, the centrifugal air pump 34, the framed filter 154 and associated components distanced from the rear cover 16. The filter assembly 150 includes the framed filter 152, a seal 204, and a plate 206 which suitably secures to the structure of the air intake enclosure 30 to assist in securing the framed filter 152 and the seal 204 to the structure of the air intake enclosure 30. Tabs 208 on the lower edge of the framed filter 152 also assist in securing the framed filter 152 and the seal 204 to the structure of the air intake enclosure 30. The centrifugal air pump 34 is suitably secured to the front edge of the centrifugal air pump enclosure 32 and the framed filter 154 is suitably secured to the centrifugal air pump enclosure outlet 194.

Figure 17:
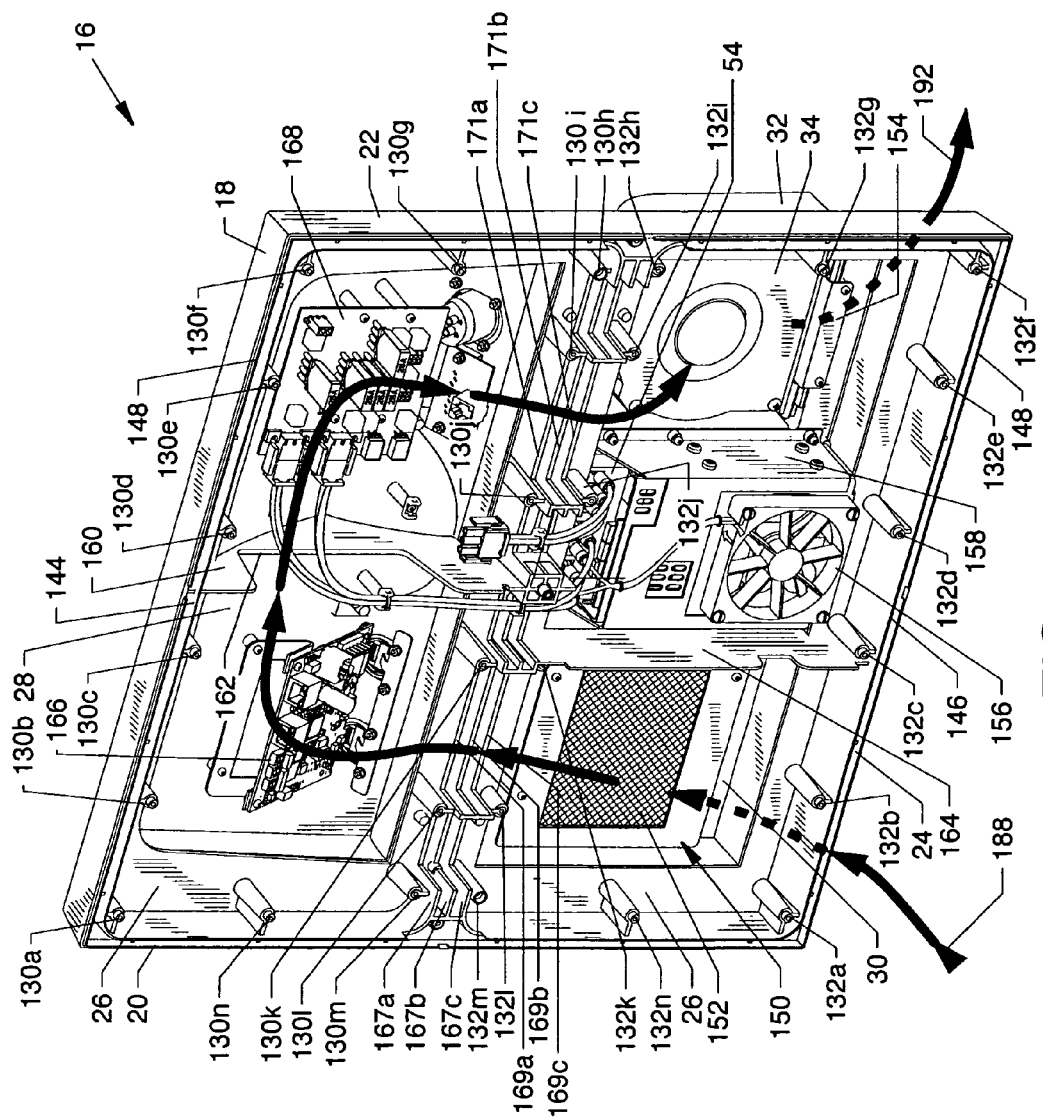

FIG. 17 shows the rear cover 16 of the LED display module 10 showing airflow along the inner regions and components of the rear cover 16. Shown in particular is the flow of cooling air 188 from the air intake enclosure 30, through the framed filter 152, through the air passage cutouts 169a, 169b and 169c, through the upper part of the rear cover 16 containing an electronic assembly 166, through the passage cutout 162, through the upper part of the rear cover 16 containing an electronic assembly 168, through the air passage cutouts 171a, 171b and 171c, and thence through the centrifugal air pump 34 and the framed filter 154 in the centrifugal air pump enclosure 32 to exit through the centrifugal air pump enclosure outlet 194 (FIG. 16) as exhaust air 192, which includes heat drawn and extracted from the interior of the LED display module 10. Such airflows correspondingly flow along the inner regions and components of the combined upper and lower LED display assemblies 12 and 14.

MODE OF OPERATION

Operation of the invention incorporates the use of functions and features described herein, many of which may be viewed as static in nature. Non-static moving parts are incorporated by the use of the cooling fan 156 and the internally located centrifugal air pump 34, the latter of which is incorporated to entrain and cause forced exit of generated heat from various electrical or electronic devices within the LED display module 10. Such generated heat is gathered and absorbed by the use of the thermal conductive pad 74, the heat distribution plate 76, and is wicked off by the plurality of heat sinks 82a-82n and ultimately collected and forced externally by the centrifugal air pump 34.

Static features are also included to enhance the functionability of the present invention. Superior weather sealing is incorporated by the use of the transparent overmold panel 70 which seals between the support grid 93 of the louver panel 68 and the LED packages 170a-170n. Weatherability is enhanced by the use of overlapping and snap engagement of the peripheral lip 91 of the louver panel 68 with the peripheral lip 112 of the frame 80 and closely associated sealing by the adhesive 184 and further enhanced by the use of the region of a double sealing incorporating the intimate and forcible contact between the rear of the frame 80 and the front of the rear cover 16. Viewability is enhanced by the use of the louver panel 68, whereby each LED package 170a-170n is viewable on an individual basis through co-located overmold cavity view ports 174a-174n and louver panel view ports 100a-100n. Electromagnetic interference is inhibited and suppressed by the use of materials, such as the heat distribution plate 76 acting as an RF shield in cooperation with the EMI suppressive qualities of components, such as, but not limited to, the rear cover 16.

Various modifications can be made to the present invention without departing from the apparent scope thereof.

LED DISPLAY MODULE

PARTS LIST

10 LED display module
12 upper LED display assembly
14 lower LED display assembly
16 rear cover
18 top panel
20 side panel
22 side panel
24 bottom panel
26 support panel
28 enclosure panel
30 air intake enclosure
32 centrifugal air pump enclosure
34 centrifugal air pump
36 LED display module latching system
38 framework
40 actuator mechanism
42 actuator arms
44 latch housings
46 pivotable latches
48 handle
50 heat sink
52 gasket
54 electronics module
56 alignment posts
58 upper weather seal
60 upper weather seal
62 lower weather seal
64 lower weather seal
66 connector plate
68 access opening
70 louver panel
72 overmold panel
74 LED printed circuit board
76 thermal conductive pad
78 heat distribution plate
80 weather seal
82 frame
82a-n heat sinks
84 top panel
86 side panel
88 side panel
90 bottom panel
91 peripheral lip
92 latch
93 support grid (of louver panel 68)
94a-n supports
96a-n supports
100a-n louver panel view ports
102a-n engagement pins
103 notch
104 top panel
105 notch
106 side panel
108 side panel
110 bottom panel
112 peripheral lip
114 catch
115 peripheral lip
116 central panel
118a-n openings
120 notch
122 notch
124a-n pins
126 weather seal channel
128a-n threaded inserts
130a-n fastener housings
132a-n fastener housings
134 support grid (of frame 80)
136a-n supports
138a-n supports
140a-n pin receiver posts
142 cavity
144 inner lip
146 inner lip
148 segmented peripheral outer lip
150 filter assembly
152 framed filter
154 framed filter
156 cooling fan
158 enclosure
160 panel
162 air passage cutout
164 panel
166 electronic assembly
167a-c support panels
168 electronic assembly
169a-c air passage cutouts
170a-n LED packages
171a-c air passage cutouts 174a-n overmold cavity view port
176 continuous angled surface
178 continuous sub-lip
179 louvers
180 opening
182 openings
184 sealant
186 various electronic components
188 cooling air
190 air intake enclosure inlet
192 heated exhaust air
194 centrifugal air pump enclosure outlet
196 signal input receptacle
198 signal output receptacle
200 power receptacle
202 diagnostic display
204 seal
206 plate It is claimed:

1. An LED display module comprising:
at least one display assembly, the at least one display assembly including:
a printed circuit board having a plurality of spaced LED packages, each LED package including one or more LEDS, coupled on a first major surface of said printed circuit board,
a louver panel adjacent the plurality of LED packages, the louver panel including a support grid having a plurality of overmold cavity view ports projecting from the support grid, each of the plurality of overmold cavity view ports is in respective alignment with each of the plurality of LED packages and each overmold cavity viewport covers and isolates a respective LED package and allows viewing of the respective covered LED package through the overmold cavity view port, and
a frame sealed to the louver panel with the printed circuit board and plurality of LED packages correspondingly sealed therebetween.

2. The LED display module of claim 1, comprising a thermal conductive pad adjacent a second major surface of the printed circuit board, the second major surface being opposite to the first major surface on which the plurality of LED packages are coupled.

3. The LED display module of claim 2, comprising a heat distribution plate adjacent the thermal conductive pad and positioned between the thermal conductive pad and the frame, and
wherein the heat distribution plate is made from or coated with an RFI suppression material.

4. The LED display module of claim 1, wherein the at least one display assembly includes at least a first display assembly and a second display assembly, the first and second display assemblies coupled in a side-by-side arrangement.

5. The LED display module of claim 1, wherein the frame includes at least one peripheral lip, and further comprising a rear cover including a peripheral lip, the rear cover positioned such that the frame is juxtaposed between the louver panel and the rear cover; and wherein a peripheral lip of the frame is configured to engage with the peripheral lip of the rear cover, and wherein a weather sealing material is located between or adjacent such engagement to seal the frame and the rear cover, and wherein the rear cover includes an inner circumferential lip and the frame includes a corresponding inner recess for receiving the inner circumferential lip, and wherein the weather sealing material is located at least partially between the inner circumferential lip and the inner recess to further seal the frame and the rear cover.

6. The LED display module of claim 1, wherein the frame includes at least one peripheral lip, and further comprising a rear cover including a peripheral lip, the rear cover positioned such that the frame is juxtaposed between the louver panel and the rear cover; and wherein a peripheral lip of the frame is configured to engage with the peripheral lip of the rear cover, and wherein a weather sealing material is located between or adjacent such engagement to seal the frame and the rear cover, and wherein the louver panel includes a peripheral lip configured to engage with a second peripheral lip of the frame opposite the peripheral lip configured to engage with the rear cover, and
wherein a weather sealing material is located between or adjacent such engagement to seal the frame and the louver panel.

7. The LED display module of claim 3, comprising a weather sealing material disposed between the heat distribution plate and the frame.

8. The LED display module of claim 3, comprising a plurality of heat sinks attached to the heat distribution plate.

9. The LED display module of claim 1, wherein the frame includes at least one peripheral lip, and further comprising a rear cover including a peripheral lip, the rear cover positioned such that the frame is juxtaposed between the louver panel and the rear cover; and wherein a peripheral lip of the frame is configured to engage with the peripheral lip of the rear cover, and wherein a weather sealing material is located between or adjacent such engagement to seal the frame and the rear cover, and wherein the rear cover includes means for circulating air through a non-viewing surface of the at least one display assembly.

10. The LED display module of claim 9, wherein the means include an air inlet and an air outlet in the rear cover and a centrifugal air pump adjacent the air outlet.

11. The LED display module of claim 10, wherein the rear cover encloses a first air filter assembly adjacent the air inlet and a second air filter assembly adjacent the air outlet, and
wherein one or both of the first air filter or the second air filter include or are disposed adjacent a screen having EMI inhibiting qualities.

12. The LED display module of claim 9, wherein the means include one or more pre-structured air passageways between the air inlet and the air outlet in the rear cover.

13. The LED display module of claim 1, wherein the overmold cavity view ports include a thermoplastic elastomer overmold material arranged over or around the plurality of LED packages, the overmold material configured to engage and seal the first major surface of the printed circuit board in close proximity to the sides of the plurality of LED packages.

14. The LED display module of claim 1, wherein each of the plurality of view ports includes an angled surface or a sub-lip surrounding at least a portion of each of the plurality of LED packages, the angled surface or the sub-lip configured to protect and shade the plurality of LED packages.

15. The LED display module of claim 1, wherein one or more of the louver panel, the frame, or the rear cover are constructed of a plastic having EMI inhibiting qualities or coated with a paint having EMI inhibiting qualities.

16. The LED display module of claim 1, wherein the frame includes at least one peripheral lip, and further comprising a rear cover including a peripheral lip, the rear cover positioned such that the frame is juxtaposed between the louver panel and the rear cover; and wherein a peripheral lip of the frame is configured to engage with the peripheral lip of the rear cover, and wherein a weather sealing material is located between or adjacent such engagement to seal the frame and the rear cover.

17. An LED display module comprising:

at least one display assembly, the at least one display assembly including:

a printed circuit board having a plurality of spaced LED packages, each LED package including one or more LEDS, coupled on a first major surface of said printed circuit board, a louver panel adjacent the plurality of LED packages, the louver panel including a support grid having a plurality of view ports projecting from the support grid, each of the plurality of view ports is in respective alignment with each of the plurality of LED packages and each view ports covers a respective LED package and allows viewing of the respective covered LED package through the view port, a frame sealed to the louver panel with the printed circuit board and plurality of LED packages correspondingly sealed therebetween; and a thermoplastic elastomer overmold material arranged over or around the plurality of LED packages, the overmold material configured to engage and seal the first major surface of the printed circuit board in close proximity to the sides of the plurality of LED packages.

18. The LED display module of claim 17, wherein each of the plurality of view ports includes an angled surface or a sub-lip surrounding at least a portion of each of the plurality of LED packages, the angled surface or the sub-lip configured to protect and shade the plurality of LED packages.

19. The LED display module of claim 17, wherein one or more of the louver panel, the frame, or the rear cover are constructed of a plastic having EMI inhibiting qualities or coated with a paint having EMI inhibiting qualities.

* * * * *